(12) United States Patent
Naito

(10) Patent No.: US 10,930,647 B2
(45) Date of Patent: Feb. 23, 2021

(54) SEMICONDUCTOR DEVICE INCLUDING TRENCHES FORMED IN TRANSISTOR OR DIODE PORTIONS

(71) Applicant: FUJI ELECTRIC CO., LTD., Kanagawa (JP)

(72) Inventor: Tatsuya Naito, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 197 days.

(21) Appl. No.: 15/900,810

(22) Filed: Feb. 21, 2018

(65) Prior Publication Data

US 2018/0182754 A1    Jun. 28, 2018

Related U.S. Application Data

(63) Continuation of application No. PCT/JP2017/009843, filed on Mar. 10, 2017.

(30) Foreign Application Priority Data

| Mar. 10, 2016 | (JP) | JP2016-047188 |
| Oct. 13, 2016 | (JP) | JP2016-201972 |
| Feb. 14, 2017 | (JP) | JP2017-024925 |

(51) Int. Cl.
*H01L 29/78* (2006.01)
*H01L 29/739* (2006.01)
(Continued)

(52) U.S. Cl.
CPC .......... *H01L 27/0635* (2013.01); *H01L 21/76* (2013.01); *H01L 21/765* (2013.01);
(Continued)

(58) Field of Classification Search
CPC ............. H01L 29/7325; H01L 29/7302; H01L 29/7397; H01L 29/6634; H01L 29/41708;
(Continued)

(56) References Cited

U.S. PATENT DOCUMENTS 5,977,570 A * 11/1999 Takahashi ........... H01L 29/0692
257/136
10,056,450 B2    8/2018 Kouno
(Continued)

FOREIGN PATENT DOCUMENTS

| CN | 103765582 A | 4/2014 |
| CN | 104995737 A | 10/2015 |

(Continued)

OTHER PUBLICATIONS

International Search Report for International Patent Application No. PCT/JP2017/009843, issued by the Japan Patent Office dated May 30, 2017.

(Continued)

*Primary Examiner* — Mohsen Ahmadi

(57) ABSTRACT

A semiconductor device that allows easy hole extraction is provided. The semiconductor device includes: a semiconductor substrate having drift and base regions; a transistor portion formed in the semiconductor substrate; and a diode portion formed adjacent to the transistor portion and in the semiconductor substrate. In the transistor portion and the diode portion: a plurality of trench portions each arrayed along a predetermined array direction; and a plurality of mesa portions formed between respective trench portions are formed, among the plurality of mesa portions, at least one boundary mesa portion at a boundary between the transistor portion and the diode portion includes a contact region at an upper surface of the semiconductor substrate and having a concentration higher than that of the base region, and an area of the contact region at the boundary mesa portion is greater than an area of the contact region at another mesa portion.

25 Claims, 17 Drawing Sheets

(51) Int. Cl.
*H01L 29/08* (2006.01)
*H01L 29/36* (2006.01)
*H01L 29/40* (2006.01)
*H01L 29/423* (2006.01)
*H01L 27/06* (2006.01)
*H01L 27/07* (2006.01)
*H01L 21/76* (2006.01)
*H01L 29/861* (2006.01)
*H01L 21/765* (2006.01)
*H01L 29/06* (2006.01)
*H01L 29/10* (2006.01)
*H01L 29/32* (2006.01)

(52) U.S. Cl.
CPC ...... *H01L 27/0727* (2013.01); *H01L 29/0696* (2013.01); *H01L 29/0834* (2013.01); *H01L 29/1095* (2013.01); *H01L 29/32* (2013.01); *H01L 29/36* (2013.01); *H01L 29/404* (2013.01); *H01L 29/405* (2013.01); *H01L 29/407* (2013.01); *H01L 29/4238* (2013.01); *H01L 29/739* (2013.01); *H01L 29/7397* (2013.01); *H01L 29/78* (2013.01); *H01L 29/8613* (2013.01); *H01L 29/8611* (2013.01)

(58) Field of Classification Search
CPC ............. H01L 29/1095; H01L 29/0696; H01L 27/0629; H01L 27/0727; H01L 29/78; H01L 29/739
See application file for complete search history.

(56) References Cited

U.S. PATENT DOCUMENTS

| | | | |
|---|---|---|---|
| 10,062,753 B2 | 8/2018 | Kouno | |
| 10,388,773 B2 | 8/2019 | Sumitomo | |
| 2008/0197379 A1 | 8/2008 | Aono | |
| 2009/0020852 A1* | 1/2009 | Harada | H01L 29/7397 257/579 |
| 2009/0230500 A1* | 9/2009 | Yoshikawa | H01L 27/0255 257/470 |
| 2009/0278166 A1 | 11/2009 | Soeno et al. | |
| 2009/0283797 A1* | 11/2009 | Takahashi | H01L 29/7397 257/139 |
| 2013/0037853 A1* | 2/2013 | Onozawa | H01L 29/0839 257/139 |
| 2013/0082301 A1* | 4/2013 | Onozawa | H01L 29/36 257/139 |
| 2014/0084337 A1 | 3/2014 | Matsudai et al. | |
| 2014/0217465 A1 | 8/2014 | Soeno | |
| 2014/0339600 A1* | 11/2014 | Yoshikawa | H01L 29/1095 257/139 |
| 2015/0144995 A1 | 5/2015 | Takahashi | |
| 2015/0380536 A1 | 12/2015 | Kimura | |
| 2016/0027906 A1* | 1/2016 | Onozawa | H01L 29/66348 257/144 |
| 2016/0043073 A1* | 2/2016 | Tamura | H01L 29/1095 257/140 |
| 2016/0141400 A1 | 5/2016 | Takahashi | |
| 2016/0336404 A1* | 11/2016 | Naito | H01L 29/42368 |
| 2016/0336435 A1* | 11/2016 | Naito | H01L 27/0635 |
| 2017/0018636 A1* | 1/2017 | Naito | H01L 29/0696 |
| 2017/0025410 A1 | 1/2017 | Cheng et al. | |
| 2017/0077217 A1* | 3/2017 | Ogawa | H01L 29/0619 |
| 2017/0162560 A1 | 6/2017 | Takahashi et al. | |
| 2017/0271447 A1* | 9/2017 | Tamura | H01L 27/0727 |
| 2018/0158815 A1* | 6/2018 | Onozawa | H01L 27/0629 |

FOREIGN PATENT DOCUMENTS

| | | |
|---|---|---|
| JP | 2008205015 A | 9/2008 |
| JP | 2009-076733 A | 4/2009 |
| JP | 2009-272550 A | 11/2009 |
| JP | 2010-238721 A | 10/2010 |
| JP | 2012-043890 A | 3/2012 |
| JP | 2013-080796 A | 5/2013 |
| JP | 2014-103376 A | 6/2014 |
| JP | 2014-197076 A | 10/2014 |
| JP | 2015-103697 A | 6/2015 |
| JP | 2015-135954 A | 7/2015 |
| JP | 2015185742 A | 10/2015 |
| JP | 2016029710 A | 3/2016 |
| JP | 2016096222 A | 5/2016 |
| JP | 2017059711 A | 3/2017 |
| WO | 2013/030943 A1 | 3/2013 |
| WO | 2016/030966 A1 | 3/2016 |

OTHER PUBLICATIONS

Office Action issued for counterpart Japanese Application No. 2019-127251, issued by the Japan Patent Office dated Jun. 23, 2020 (drafted on Jun. 15, 2020).

Office Action issued for counterpart Chinese Application 201780002868.7, issued by the China National Intellectual Property Administration dated Sep. 15, 2020.

* cited by examiner d-d'

300

SEMICONDUCTOR DEVICE INCLUDING TRENCHES FORMED IN TRANSISTOR OR DIODE PORTIONS

The contents of the following Japanese patent application(s) are incorporated herein by reference:
NO. 2016-047188 filed in JP on Mar. 10, 2016,
NO. 2016-201972 filed in JP on Oct. 13, 2016,
NO. 2017-024925 filed in JP on Feb. 14, 2017, and
NO. PCT/JP2017/009843 filed on Mar. 10, 2017.

BACKGROUND

1. Technical Field

The present invention relates to a semiconductor device.

2. Related Art

Conventionally, a semiconductor device in which a transistor such as an IGBT and a diode such as a FWD are formed on the same chip has been known (please see Patent Document 1, for example).
Japanese Patent Application Publication No. 2015-135954
It is preferable if in a semiconductor device such as an IGBT, holes can be extracted efficiently at the time of turn-off.

GENERAL DISCLOSURE

A first aspect of the present invention provides a semiconductor device. The semiconductor device may include a semiconductor substrate. The semiconductor substrate may have a first conductivity type drift region. The semiconductor substrate may have a second conductivity type base region provided above the drift region. The semiconductor device may include a transistor portion formed in the semiconductor substrate. The semiconductor device may include a diode portion formed adjacent to the transistor portion and in the semiconductor substrate. In the transistor portion and the diode portion, a plurality of trench portions each arrayed along a predetermined array direction may be formed In the transistor portion and the diode portion, a plurality of mesa portions formed between respective trench portions may be formed. Among the plurality of mesa portions, at least one boundary mesa portion at a boundary between the transistor portion and the diode portion may include a second conductivity type contact region that is at an upper surface of the semiconductor substrate and has a concentration higher than that of the base region. An area of the contact region at the boundary mesa portion may be greater than an area of the contact region at another mesa portion In the mesa portion formed in the transistor portion, an accumulation region that has a concentration higher than that of the drift region may be provided between the base region and the drift region. At least one among the boundary mesa portions may not be provided in the accumulation region.

Among the plurality of trench portions, a trench portion adjacent to the boundary mesa portion may be a dummy trench portion. Among the plurality of trench portions, at least one trench portion provided adjacent to a trench portion adjacent to the boundary mesa portion and on the transistor portion side relative to the trench portion adjacent to the boundary mesa portion may be a dummy trench portion.

The accumulation region may have a first accumulation region formed at a predetermined depth position. The accumulation region may have a second accumulation region formed closer to the diode portion than the first accumulation region is and at a position shallower than the first accumulation region is. A trench portion adjacent to the second accumulation region may be a dummy trench portion.

The diode portion may have a lifetime killer on an upper surface side of the semiconductor substrate. In a region where the first accumulation region is formed, the transistor portion may not have the lifetime killer on the upper surface side of the semiconductor substrate. The boundary mesa portion may have a lifetime killer on the upper surface side of the semiconductor substrate.

At the upper surface of the semiconductor substrate, the mesa portion on the transistor portion side relative to the boundary mesa portion may have: a first conductivity type emitter region that has a concentration higher than that of the drift region; and the contact region. The boundary mesa portion may not have the emitter region. At least parts of the mesa portions on the diode portion side relative to the boundary mesa portion may have the base region at the upper surface of the semiconductor substrate.

Assuming that: a distance from a boundary between the transistor portion and the diode portion to the trench portion between the mesa portion having the emitter region and the boundary mesa portion is Da, and a distance from a lower surface of the semiconductor substrate to a lower surface of the base region is Dt, a relationship 100 µm<Da+Dt<150 µm may be satisfied.

Respective trench portions may be formed extending in an extension direction different from the array direction at the upper surface of the semiconductor substrate. The mesa portion on the transistor portion side relative to the boundary mesa portion may have the emitter region and the contact region alternately along the extension direction at the upper surface of the semiconductor substrate. In the extension direction, the accumulation region may be formed to reach an outer position relative to an end portion of the outermost emitter region.

The semiconductor device may further include an interlayer dielectric film formed at the upper surface of the semiconductor substrate. In the interlayer dielectric film, a contact hole to expose the emitter region and the contact region may be formed. In the extension direction, the contact hole may be formed to reach an outer position relative to an end portion of the accumulation region.

A second aspect of the present invention provides a semiconductor device. The semiconductor device may include a semiconductor substrate. The semiconductor substrate may have a first conductivity type drift region. The semiconductor substrate may have a second conductivity type base region provided above the drift region. The semiconductor device may include a trench portion that is formed at an upper surface of the semiconductor substrate and extending in a predetermined extension direction, and penetrates the base region. The semiconductor device may include a first conductivity type emitter region having a concentration higher than that of the drift region and a second conductivity type contact region having a concentration higher than that of the base region that are formed in a region adjacent to the trench portion at the upper surface of the semiconductor substrate and alternately along the extension direction. The semiconductor device may include a first conductivity type accumulation region that is formed between the base region and the drift region and has a concentration higher than that of the drift region. In the extension direction, the accumulation region may be formed to reach an outer position relative to an end portion of the outermost emitter region.

In the second aspect, the semiconductor device may further include am interlayer dielectric film formed at the upper surface of the semiconductor substrate. In the interlayer dielectric film, a contact hole to expose the emitter region and the contact region may be formed. In the extension direction, the contact hole may be formed to reach an outer position relative to an end portion of the accumulation region. An end portion of the accumulation region in the extension direction may be formed such that a depth of part thereof decreases as a distance of the part from an outermost edge thereof decreases.

The semiconductor device according to the second aspect may further include a second conductivity type well region that is formed at the upper surface of the semiconductor substrate and at an outer position relative to the contact region, and has a concentration higher than that of the base region. At the upper surface of the semiconductor substrate, the base region may be formed between the contact region and the well region. In the extension direction, a distance from an end portion of the emitter region to an end portion of the accumulation region may be shorter than a distance from the end portion of the accumulation region to an end portion of the contact hole.

At least a partial region below the emitter region may have a carrier passage region where the accumulation region is not formed. An entire region below the emitter region may be provided with the carrier passage region. The carrier passage region may be also provided below an end portion that is part of the contact region and adjacent to the emitter region.

The accumulation region may have a first accumulation region formed at a predetermined depth position. The accumulation region may have a second accumulation region formed closer to the emitter region than the first accumulation region is and at a position shallower than the first accumulation region is. Both the first accumulation region and the second accumulation region may be formed below the contact region.

The semiconductor device may further include an interlayer dielectric film formed at the upper surface of the semiconductor substrate. In the interlayer dielectric film, a contact hole to expose the emitter region and the contact region may be formed. In the extension direction, the accumulation region may be formed to reach an outer position relative to an end portion of the contact hole.

A third aspect of the present invention provides a semiconductor device. The semiconductor device may include a semiconductor substrate. The semiconductor substrate may have a first conductivity type drift region. The semiconductor substrate may have a second conductivity type base region provided above the drift region. The semiconductor device may include a trench portion that is formed at an upper surface of the semiconductor substrate and extending in a predetermined extension direction, and penetrates the base region. The semiconductor device may include a first conductivity type emitter region having a concentration higher than that of the drift region and a second conductivity type contact region having a concentration higher than that of the base region that are formed in a region adjacent to the trench portion at the upper surface of the semiconductor substrate and alternately along the extension direction. The semiconductor device may include a first conductivity type accumulation region that is formed between the base region and the drift region and has a concentration higher than that of the drift region. The semiconductor device may further include an interlayer dielectric film formed at the upper surface of the semiconductor substrate. In the interlayer dielectric film, a contact hole to expose the emitter region and the contact region may be formed. In the extension direction, the contact hole may be formed to reach an outer position relative to an end portion of the accumulation region.

The transistor portion and the diode portion in the semiconductor device according to the first aspect may further have a second conductivity type collector region. The collector region may be provided at least below the outermost contact region in an extension direction different from the array direction. The transistor portion may further have a first conductivity type accumulation region. The accumulation region may be provided between the base region and the drift region. The accumulation region may be of a first conductivity type and have a concentration higher than that of the drift region. An inner end portion of the collector region of the diode portion may be positioned at an inner position relative to an outer end portion of the accumulation region of the transistor portion.

The transistor portion in the semiconductor device according to the first aspect may further have a first conductivity type emitter region. The emitter region may be of a first conductivity type and have a concentration higher than that of the drift region. An inner end portion of the collector region of the diode portion may be positioned at an inner position relative to an outer end portion of the outermost emitter region in the extension direction in the transistor portion.

The semiconductor device according to the second and third aspects may further include a transistor portion and a diode portion. The transistor portion may be formed in the semiconductor substrate. The diode portion may be formed adjacent to the transistor portion and in the semiconductor substrate. The transistor portion and the diode portion may further have a second conductivity type collector region. The collector region may be provided at least below the outermost contact region in an extension direction. An inner end portion of the collector region of the diode portion may be positioned at an inner position relative to an outer end portion of the accumulation region of the transistor portion An inner end portion of the collector region of the diode portion may be positioned at an inner position relative to an outer end portion of the outermost emitter region in the extension direction in the transistor portion.

The summary clause does not necessarily describe all necessary features of the embodiments of the present invention. The present invention may also be a sub-combination of the features described above.

DESCRIPTION OF EXEMPLARY EMBODIMENTS

Hereinafter, (some) embodiment(s) of the present invention will be described. The embodiment(s) do(es) not limit the invention according to the claims, and all the combinations of the features described in the embodiment(s) are not necessarily essential to means provided by aspects of the invention.

Figure 1:
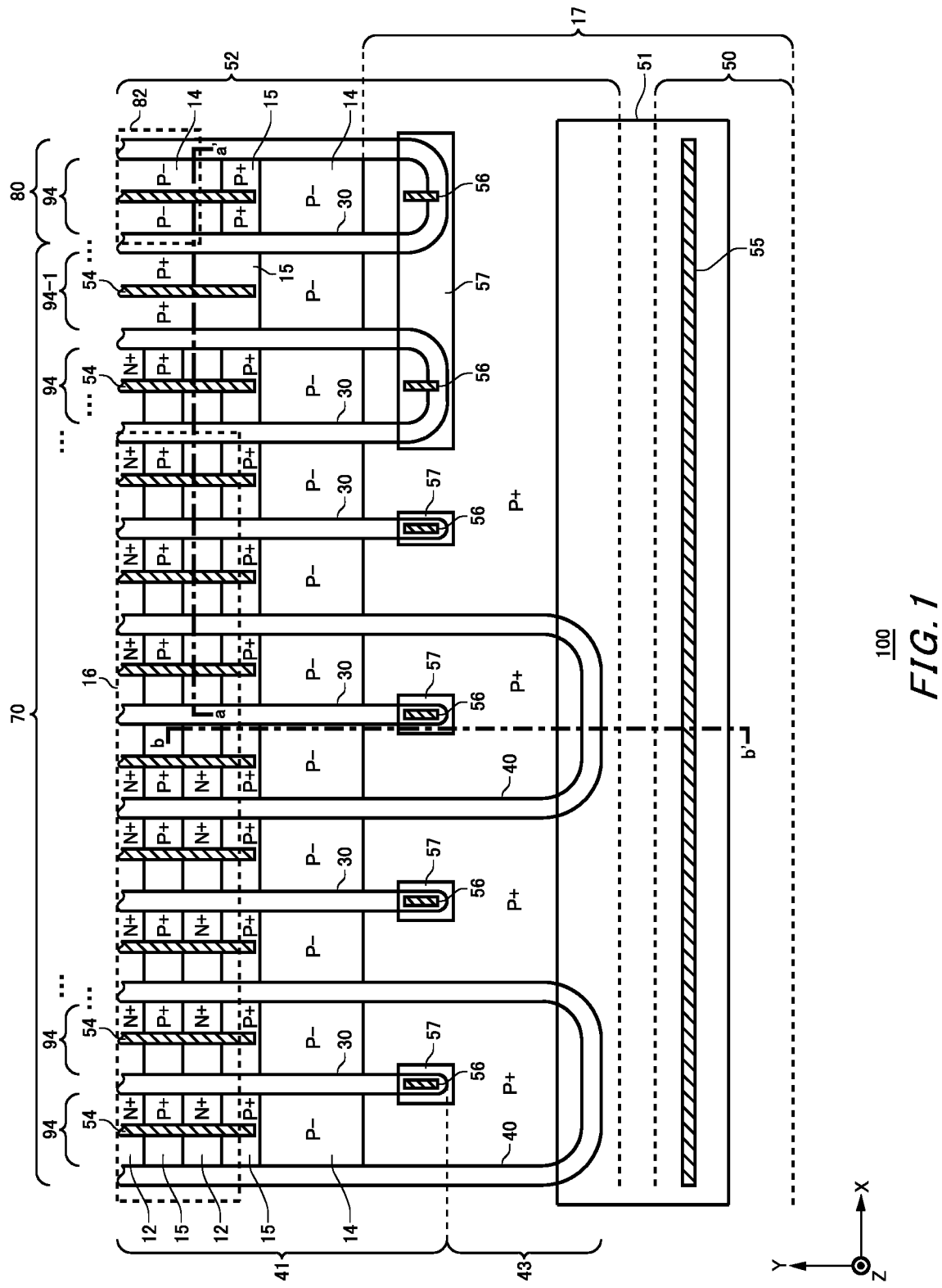
FIG. 1 is a top view showing one example of a semiconductor device 100.

FIG. 1 is a top view showing one example of a semiconductor device 100. The semiconductor device 100 of the present example is a semiconductor chip having a transistor portion 70 including a transistor such as an IGBT (Insulated Gate Bipolar Transistor) and a diode portion 80 including a diode such as a FWD (Free Wheel Diode). The diode portion 80 is formed adjacent to the transistor portion 70 at the upper surface of a semiconductor substrate. The upper surface of a semiconductor substrate refers to one of two principal surfaces of the semiconductor substrate that are opposite to each other. FIG. 1 shows a chip upper surface around a chip end portion, and other regions are omitted.

In the present specification, the diode portion 80 may be assumed to be a region on a rear surface that is in an active region and matches a cathode region, or a projection region that imaginarily appears if the cathode region is imaginarily projected toward the front surface side perpendicularly to the rear surface of the semiconductor substrate. Also, the transistor portion 70 may be assumed to be a projection region that is in the active region and imaginarily appears if a collector region is imaginarily projected toward the front surface side perpendicularly to the rear surface of the semiconductor substrate, and a region in which a predetermined unit configuration including emitter regions 12 and contact regions 15 are regularly arranged.

Also, although FIG. 1 shows an active region of the semiconductor substrate in the semiconductor device 100, the semiconductor device 100 may have an edge termination portion surrounding the active region. The active region refers to a region where current flows if the semiconductor device 100 is controlled to be turned on. The edge termination portion relaxes electric field crowding on the upper surface side of the semiconductor substrate. The edge termination portion for example has a guard ring, field plate, RESURF or a structure obtained by combining them.

The semiconductor device 100 of the present example includes gate trench portions 40, dummy trench portions 30, a well region 17, emitter regions 12, base regions 14 and contact regions 15 that are formed inside the upper surface side of the semiconductor substrate. Also, the semiconductor device 100 of the present example includes an emitter electrode 52 and a gate electrode 50 provided above the upper surface of the semiconductor substrate. The emitter electrode 52 and the gate electrode 50 are provided separate from each other. In the present specification, the gate trench portions 40 and the dummy trench portions 30 are one example of trench portions.

An interlayer dielectric film is formed between the emitter electrode 52 and the gate electrode 50, and the upper surface of the semiconductor substrate, but is omitted in FIG. 1. In the interlayer dielectric film of the present example, contact holes 54, a contact hole 55 and contact holes 56 are formed penetrating the interlayer dielectric film.

The emitter electrode 52 passes through the contact holes 54 to contact the emitter regions 12, the contact regions 15 and the base regions 14 on the upper surface of the semiconductor substrate. Also, the emitter electrode 52 passes through the contact holes 56 to be connected with dummy conductive portions in the dummy trench portions 30. Between the emitter electrode 52 and the dummy conductive portions, connection portions 57 formed of a conductive material such as polysilicon doped with impurities may be provided. The connection portions 57 are formed at the upper surface of the semiconductor substrate. Between the connection portions 57 and the semiconductor substrate, an insulating film such as a thermal oxide film is formed.

The gate electrode 50 passes through the contact hole 55 to contact a gate wire 51. The gate wire 51 is formed of polysilicon or the like doped with impurities. At the upper surface of the semiconductor substrate, the gate wire 51 is connected with gate conductive portions in the gate trench portion 40. That is, at the upper surface of the semiconductor substrate, the gate wire 51 is formed across a portion between parts of the gate trench portions 40 and the contact hole 55.

The emitter electrode 52 and the gate electrode 50 are formed of a metal-containing material. For example, at least a partial region of each electrode is formed of aluminum or an aluminum-silicon alloy. Each electrode may have a barrier metal formed of titanium, a titanium alloy or the like as a layer underlying a region formed of aluminum or the like, and may have a plug formed of tungsten or the like in a contact hole.

One or more gate trench portions 40 and one or more dummy trench portions 30 are arrayed at predetermined intervals along a predetermined array direction in the region of the transistor portion 70. In the transistor portion 70, one or more gate trench portions 40 and one or more dummy trench portions 30 may be formed alternately along the array direction. Also, dummy trench portions 30 are arrayed at predetermined intervals along the array direction in the region of the diode portion 80.

A dummy trench portion 30 is formed extending in a predetermined extension direction at the upper surface of the semiconductor substrate. Some of dummy trench portions 30 in the transistor portion 70 of the present example have linear shapes, and are formed extending in an extension direction perpendicular to the above-mentioned array direction. Also, some of dummy trench portions 30 in the transistor portion 70 have shapes consisting of two straight lines being connected by a curved portion at their end portions.

In FIG. 1, the X-axis direction is assumed to be the array direction of trench portions. Also, the Y-axis direction is assumed to be the extension direction of trench portions. The X-axis and the Y-axis are axes that are orthogonal to each other on a plane parallel with the upper surface of the semiconductor substrate. Also, the axis that is orthogonal to the X-axis and the Y-axis is assumed to be the Z-axis. In the present specification, the Z-axis direction is in some cases referred to as the depth direction.

In the transistor portion 70, at its boundary facing the diode portion 80, a plurality of dummy trench portions 30 may be arrayed continuously. The number of dummy trench portions 30 arrayed continuously at the boundary facing the diode portion 80 may be greater than the number of dummy trench portions 30 arrayed continuously at inner positions in the transistor portion 70 that are apart from the diode portion 80.

In the example of FIG. 1, in the transistor portion 70 at the boundary facing the diode portion 80, three dummy trench portions 30, in total, including two dummy trench portions 30 that are coupled at their end portions and one linear-shaped dummy trench portion 30 are arrayed continuously (a dummy trench portion 30 overlapping the boundary between the transistor portion 70 and the diode portion 80 is not counted). In contrast to this, at inner positions in the transistor portion 70, gate trench portions 40 and dummy trench portions 30 are arrayed alternately one by one.

A gate trench portion 40 has facing portions 41 and a protruding portion 43. The facing portions 41 are formed extending in the above-mentioned extension direction within a range to face a dummy trench portion 30 in the transistor portion 70. That is, the facing portions 41 are formed in parallel with the dummy trench portion 30. The protruding portion 43 extends further from the facing portions 41 and is formed in a range not to face the dummy trench portion 30. In the present example, two facing portions 41 provided on both the sides of a dummy trench portion 30 are connected by one protruding portion 43. At least part of the protruding portion 43 may have a curved shape.

In a protruding portion 43, a gate conductive portion in a gate trench portion 40 and the gate wire 51 are connected. The gate wire 51 may be connected with the gate conductive portion in a region of the protruding portion 43 that is farthest from facing portions 41. In the region farthest from the facing portions 41, the protruding portion 43 of the present example has a portion that extends in a direction orthogonal to the facing portions 41. The gate wire 51 may connect with the gate conductive portion at the portion of the protruding portion 43.

A dummy trench portion 30 in the diode portion 80 may have a shape similar to that of a dummy trench portion 30 in a gate trench portion 40 or may have a shape similar to that of a gate trench portion 40. However, a dummy trench portion 30 in the diode portion 80 has a length which is the same as that of a dummy trench portion 30 in the transistor portion 70.

The emitter electrode 52 is formed above the gate trench portions 40, the dummy trench portions 30, the well region 17, the emitter regions 12, the base regions 14 and the contact regions 15. The well region 17 is formed in a predetermined range from an end portion of an active region on the side in which the gate electrode 50 is provided. The diffusion depth of the well region 17 may be greater than the depths of the gate trench portions 40 and the dummy trench portions 30. Partial regions of the gate trench portions 40 and the dummy trench portions 30 on the gate electrode 50 side are formed in the well region 17. The bottoms of the ends of the dummy trench portions 30 in the extension direction may be covered by the well region 17.

A protruding portion 43 of a gate trench portion 40 may be entirely formed in the well region 17. The semiconductor substrate is of a first conductivity type, and the well region 17 is of a second conductivity type which is different from the conductivity type of the semiconductor substrate. The semiconductor substrate of the present example is of N−−-type, and the well region 17 is of P+-type. In the present example explained, the first conductivity type is N-type, and the second conductivity type is P-type. However, the first and second conductivity types may be opposite conductivity types.

In a mesa portion 94 which is a region sandwiched by respective trench portions, a base region 14 is formed. Furthermore, the mesa portion 94 may be a region sandwiched by adjacent trench portions along the array direction and a region from a position which is deepest at the bottom surfaces of the trench portions to the upper surface (in other words, the front surface) of the semiconductor substrate. The base region 14 is of a second conductivity type with a doping concentration lower than that of the well region 17. The base region 14 of the present example is of P−−-type.

At the upper surface of a base region 14 in a mesa portion 94, a second conductivity type contact region 15 having a doping concentration higher than that of the base region 14 is formed. The contact region 15 of the present example is of P+-type. Also, in the transistor portion 70, at part of the upper surface of the contact region 15, a first conductivity type emitter region 12 with a doping concentration higher than that of the semiconductor substrate is selectively formed. The emitter region 12 of the present example is of N+-type.

Each of the contact region 15 and the emitter region 12 is formed extending from one of adjacent trench portions to the other trench portion. One or more contact regions 15 and one or more emitter regions 12 of the transistor portion 70 are formed so as to be exposed to the upper surface of a mesa portion 94 alternately along the extension direction of trench portions. In a mesa portion 94 of the diode portion 80, a contact region 15 is formed in a region facing at least one contact region 15 in the transistor portion 70. In the example of FIG. 1, in a mesa portion 94 of the diode portion 80, a contact region 15 is formed in a region facing a contact region 15 that is in the transistor portion 70 and is closest to the gate electrode 50, and base regions 14 are formed in other regions.

In the transistor portion 70, the contact holes 54 are formed above respective regions of contact regions 15 and emitter regions 12. The contact holes 54 are not formed in regions corresponding to base regions 14 and the well region 17.

In the diode portion 80, the contact hole 54 is formed above the contact region 15 and the base regions 14. Contact holes 54 of the present example are not formed for base regions 14 which are among a plurality of base regions 14 in the mesa portions 94 of the diode portion 80 and are closest to the gate electrode 50. In the present example, the contact holes 54 of the transistor portion 70 and the contact hole 54 of the diode portion 80 have the same length in the extension direction of respective trench portions. Although in the diode portion 80 of FIG. 1, a contact region 15 is formed at an end of the contact hole 54 in the extension direction, this contact region 15 may not be present. Also, if in the diode portion 80 also, a plug formed of tungsten or the like is formed in a contact hole, a contact region 15 may be formed at a surface of a base region 14 exposed through a contact hole.

Among a plurality of mesa portions 94, at least one boundary mesa portion 94-1 at the boundary between the transistor portion 70 and the diode portion 80 has, at the upper surface of the semiconductor substrate, a P+-type contact region 15 having a concentration higher than that of base regions 14. The area of the contact region 15 exposed to the upper surface of the semiconductor substrate at the boundary mesa portion 94-1 is greater than the areas of contact regions 15 exposed to the upper surface of the semiconductor substrate at other mesa portions 94.

In the example of FIG. 1, one mesa portion 94 that is adjacent to the boundary between the transistor portion 70 and the diode portion 80 and is on the transistor portion 70 side is the boundary mesa portion 94-1. In the boundary mesa portion 94-1, in addition to regions where contact regions 15 are formed in other mesa portions 94 of the transistor portion 70, also in regions where emitter regions 12 are formed in other mesa portions 94 of the transistor portion 70, contact regions 15 are formed. That is, the boundary mesa portion 94-1 of the present example does not have an emitter region 12 at the upper surface of the semiconductor substrate.

Also, at least parts of mesa portions 94 on the diode portion 80 side relative to the boundary mesa portion 94-1 have base regions 14 at the upper surface of the semiconductor substrate. In the mesa portions 94, the region facing the contact region 15 in the boundary mesa portion 94-1 is also a base region 14. The base regions 14 in the present example function as anode regions of a diode.

Also, in a partial region of the transistor portion 70, accumulation regions 16 are formed below base regions 14. In FIG. 1, the region where the accumulation regions 16 are formed is indicated with dotted lines. Also, in a partial region of the diode portion 80, a cathode region 82 is formed below a base region 14. In FIG. 1, the region where the cathode region 82 is formed is indicated with dotted lines.

The cathode region 82 may be at a position that imaginarily appears on the lower surface of the semiconductor substrate if a base region 14 exposed to the upper surface (in other words, the front surface) of the semiconductor substrate is imaginarily projected onto the lower surface. In other words, the cathode region 82 may be separated from a position that imaginarily appears on the lower surface (in other words, the rear surface) of the semiconductor substrate if a contact region 15 formed at an end of the contact hole 54 in the extension direction of trench portions is projected onto the lower surface.

Figure 2:
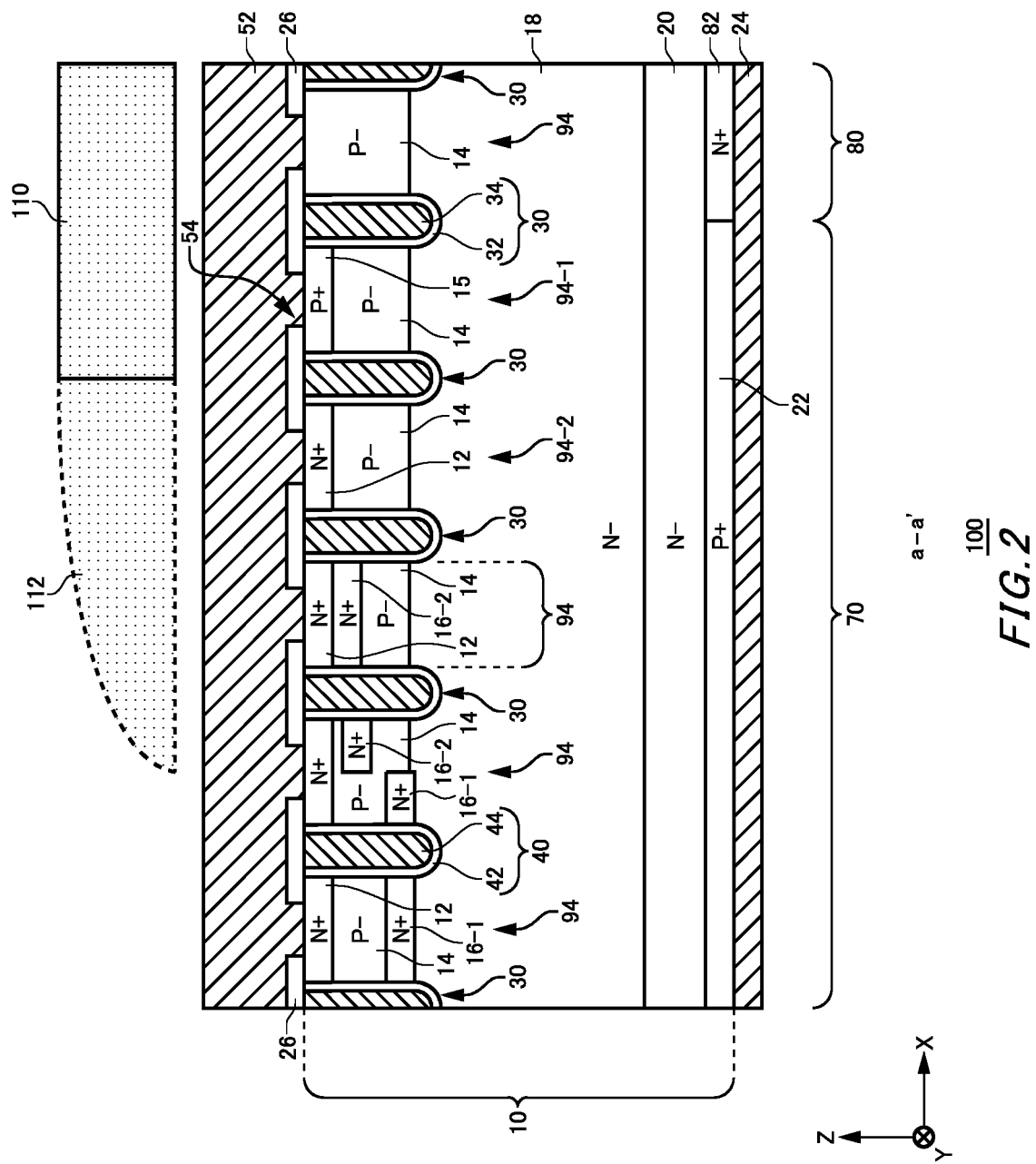
FIG. 2 is a figure showing one example of a cross-section taken along a-a' through the semiconductor device 100 shown in FIG. 1.

FIG. 2 is a figure showing one example of a cross-section taken along a-a' through the semiconductor device 100 shown in FIG. 1. The cross-section taken along a-a' is a cross-section that is parallel with the X-Z plane and passes through emitter regions 12 of the transistor portion 70. In FIG. 2, a mask 110 used at the manufacture of the semiconductor device 100 is shown as well.

In the cross-section, the semiconductor device 100 of the present example has a semiconductor substrate 10, an interlayer dielectric film 26, the emitter electrode 52 and a collector electrode 24. The emitter electrode 52 is formed at the upper surfaces of the semiconductor substrate 10 and the interlayer dielectric film 26.

The collector electrode 24 is formed at the lower surface of the semiconductor substrate 10. The lower surface refers to the surface opposite to the upper surface. The emitter electrode 52 and the collector electrode 24 are formed of conductive materials such as metal. Also in the present specification, surfaces or end portions of respective members such as a substrate, a layer or a region on the emitter electrode 52 side are referred to as upper surfaces or upper ends, and their surfaces or end portions on the collector electrode 24 side are referred to as lower surfaces or lower ends. Also, the direction linking the emitter electrode 52 and the collector electrode 24 is referred to as the depth direction.

The semiconductor substrate 10 may be a silicon substrate, a silicon carbide substrate, a nitride semiconductor substrate such as a gallium nitride substrate or the like. On the upper surface side of the semiconductor substrate 10, P--type base regions 14 are formed.

In the cross-section, on the upper surface side of each mesa portion 94 of the transistor portion 70, an N+-type emitter region 12, a P--type base region 14 and an N+-type accumulation region 16 are formed sequentially from the upper surface side of the semiconductor substrate 10.

In the cross-section, on the upper surface side of each mesa portion 94 of the diode portion 80, a P--type base region 14 is formed. In each mesa portion 94 of the diode portion 80, an accumulation region 16 is not formed.

In the transistor portion 70, an N--type drift region 18 is formed at the lower surfaces of the accumulation regions 16. By providing the accumulation regions 16 having concentrations higher than that of the drift region 18 between the drift region 18 and the base regions 14, a carrier injection-enhancement effect (IE effect) can be enhanced to lower ON-voltage.

The accumulation regions 16 are formed in respective mesa portions 94 of the transistor portion 70. The accumulation regions 16 may be provided to cover the entire lower surfaces of the base regions 14 in the respective mesa portions 94. However, in some mesa portions 94 near the boundary between the transistor portion 70 and the diode portion 80, the lower surfaces of the base regions 14 are not covered by accumulation regions 16.

In the diode portion 80, the drift region 18 is formed at the lower surface of the base region 14. In both the transistor portion 70 and the diode portion 80, an N--type buffer region 20 is formed at the lower surface of the drift region 18.

The buffer region 20 is formed on the lower surface side of the drift region 18. The doping concentration of the buffer region 20 is higher than the doping concentration of the drift region 18. The buffer region 20 may function as a field-stop layer than prevents a depletion layer spreading from the lower surface side of the base region 14 from reaching a P+-type collector region 22 and the N+-type cathode region 82.

In the transistor portion 70, the P+-type collector region 22 is formed at the lower surface of the buffer region 20. In the diode portion 80, the N+-type cathode region 82 is formed at the lower surface of the buffer region 20.

In the present specification, a plane that passes through the boundary between the collector region 22 and the cathode region 82 and is parallel with the Y-Z plane is assumed to be the boundary between the transistor portion 70 and the diode portion 80. The boundary between the collector region 22 and the cathode region 82 may be at a position where the distribution of the net doping concentration of impurities in the X-axis direction exhibits the minimum value. Any of dummy trench portions 30 may be formed at the boundary between the transistor portion 70 and the diode portion 80. Also, the position of a dummy trench portion 30 along the X-axis that is closest to a position at which the net doping concentration exhibits the minimum value may be assumed to be the boundary position between the transistor portion 70 and the diode portion 80. Also, the collector electrode 24 is provided at the lower surfaces of the collector region 22 and the cathode region 82.

On the upper surface side of the semiconductor substrate 10, one or more gate trench portions 40 and one or more dummy trench portions 30 are formed. Each trench portion extends from the upper surface of the semiconductor substrate 10, penetrates a base region 14 and reaches the drift region 18. In a region where at least any of an emitter region 12, a contact region 15 and an accumulation region 16 is provided, each trench portion also penetrates the region(s) provided and reaches the drift region 18.

A gate trench portion 40 has a gate trench, a gate-insulating film 42 and a gate conductive portion 44 that are formed on the upper surface side of the semiconductor substrate 10. The gate-insulating film 42 is formed covering the inner wall of the gate trench. The gate-insulating film 42 may be formed by oxidizing or nitriding a semiconductor at the inner wall of the gate trench. The gate conductive portion 44 is formed inside the gate-insulating film 42 within the gate trench. That is, the gate-insulating film 42 insulates the gate conductive portion 44 from the semiconductor substrate 10. The gate conductive portion 44 is formed of a conductive material such as polysilicon.

The gate conductive portion 44 includes, in the Z-axis direction, at least a region facing an adjacent base region 14. The gate trench portion 40 is covered by the interlayer dielectric film 26 at the upper surface of the semiconductor substrate 10. In the present example, as shown in FIG. 1, a gate conductive portion 44 at a protruding portion 43 electrically connects with the gate electrode 50 via the gate wire 51. If a predetermined voltage is applied to the gate conductive portion 44, a channel is formed at a front layer of the interface that is part of a base region 14 and contacts the gate trench.

In the cross-section, a dummy trench portion 30 may have a structure which is the same as that of a gate trench portion 40. A dummy trench portion 30 has a dummy trench, a dummy insulating film 32 and a dummy conductive portion 34 that are formed on the upper surface side of the semiconductor substrate 10. The dummy insulating film 32 is formed covering the inner wall of the dummy trench. The dummy conductive portion 34 is formed within the dummy trench and formed inside the dummy insulating film 32. The dummy insulating film 32 insulates the dummy conductive portion 34 from the semiconductor substrate 10. The dummy conductive portion 34 may be formed of a material which is the same as that of a gate conductive portion 44. For example, the dummy conductive portion 34 is formed of a conductive material such as polysilicon. The dummy conductive portion 34 may have a length in the depth direction which is the same as that of a gate conductive portion 44.

A dummy trench portion 30 is covered by the interlayer dielectric film 26 at the upper surface of the semiconductor substrate 10. In the present example, as shown in FIG. 1, a dummy conductive portion 34 electrically connects with the emitter electrode 52 via a contact hole 56.

In the present example, in the boundary mesa portion 94-1 that is among the plurality of mesa portions 94 and is at the boundary between the transistor portion 70 and the diode portion 80, an emitter region 12 exposed to the upper surface of the semiconductor substrate 10 is not formed, but a contact region 15 exposed to the upper surface of the semiconductor substrate 10 is formed. As shown in FIG. 1, over the entire boundary mesa portion 94-1, an emitter region 12 exposed to the upper surface of the semiconductor substrate 10 is preferably not formed. The contact region 15 of the boundary mesa portion 94-1 is connected with the emitter electrode 52 via a contact hole 54.

The mesa portion 94 at the boundary between the transistor portion 70 and the diode portion 80 refers to a mesa portion 94 overlapping the boundary in the X-axis. If the boundary overlaps any trench portion in the X-axis, a mesa portion 94 adjacent to the boundary between the transistor portion 70 and the diode portion 80 refers to a mesa portion 94 adjacent to the trench portion. In the present example, among mesa portions 94 adjacent to a dummy trench portion 30-1 overlapping the boundary between the transistor portion 70 and the diode portion 80, the mesa portion 94 on the transistor portion 70 side is the boundary mesa portion 94-1.

A plurality of mesa portions 94 that are adjacent to the boundary between the transistor portion 70 and the diode portion 80 and are continuous in the array direction may be the boundary mesa portions 94-1. Also, a mesa portion 94 adjacent to the boundary on the diode portion 80 side may be the boundary mesa portion 94-1.

By providing the boundary mesa portion 94-1, holes near the boundary between the transistor portion 70 and the diode portion 80 can be extracted efficiently at the time of turn-off of the semiconductor device 100. Thereby, tail current at the time of turn-off can be reduced efficiently to reduce loss at the time of turn-off. Also, lowering of the withstand capability of the semiconductor device 100 can be suppressed. Also, flow of holes accumulated in the region of the transistor portion 70 into the region of the diode portion 80 can be suppressed to reduce influence on the diode portion 80.

Also, at least one among the boundary mesa portions 94-1 is preferably not provided with an accumulation region 16. As one example, all the boundary mesa portions 94-1 are not provided with accumulation regions 16. Thereby, holes can be extracted in the boundary mesa portions 94-1 without being inhibited by accumulation regions 16.

The mask 110 is used at a step of implanting impurities into a region corresponding to the accumulation regions 16. The mask 110 is arranged to cover the diode portion 80 and the boundary mesa portion 94-1. The mask 110 may be formed by applying a resist or the like, followed by patterning into a predetermined shape. Accumulation regions 16 are not formed in regions covered by the mask 110, and accumulation regions 16 are formed in regions not covered by the mask 110.

An end portion of the mask 110 is preferably formed perpendicularly at a position where it aligns with an end portion of the boundary mesa portion 94-1. But if dripping of resist or the like occurs to the mask 110, an excess portion 112 may be formed beyond the above-mentioned position. If the excess portion 112 is formed, an accumulation region 16 is not formed at a predetermined depth in a mesa portion 94 covered by the excess portion 112. For example, in the mesa portion 94 covered by the excess portion 112, an accumulation region 16 is not formed at all or the depth position where it is formed becomes shallower than a predetermined depth.

Accumulation regions 16 of the present example include a first accumulation region 16-1 and a second accumulation region 16-2. The first accumulation region 16-1 is formed at a predetermined depth position. The first accumulation region 16-1 is formed at an inner position in the transistor portion 70.

The second accumulation region 16-2 is formed at a position closer to the diode portion 80 than the first accumulation region 16-1 is. The second accumulation region 16-2 is formed at a position shallower than the first accumulation region 16-1 is. That is, the second accumulation region 16-2 is formed on the upper surface side of the semiconductor substrate 10 relative to the first accumulation region 16-1. The positions at which second accumulation regions 16-2 are formed may be gradually shallower as their distances to the diode portion 80 decrease. First accumulation regions 16-1 and second accumulation regions 16-2 may be formed continuously, and may also be formed discontinuously in the depth direction.

If the depth position of an accumulation region 16 changes, the length of a base region 14 in the mesa portion 94 in the depth direction changes. Because of this, if a gate trench portion 40 is provided adjacent to the mesa portion 94, a threshold voltage Vth of the mesa portion 94 varies relative to a threshold voltage Vth of another mesa portion 94, and fluctuation of threshold voltages increases. Also, fluctuation of saturation current increases. Also, forward voltage of the diode portion 80 becomes lower than a predetermined design value in some cases.

In contrast to this, in the semiconductor device 100 of the present example, trench portions adjacent to the boundary mesa portion 94-1 are dummy trench portions 30. Also, at least one trench portion provided adjacent to the trench portion adjacent to the boundary mesa portion 94-1 and at an inner position in the transistor portion 70 side relative to the trench portion adjacent to the boundary mesa portion 94-1 is a dummy trench portion 30. Thereby, fluctuation of threshold voltage and the like can be reduced. More preferably, all the trench portions adjacent to a mesa portion 94 provided with a second accumulation region 16-2 are dummy trench portions 30. Also, all the trench portions on the diode portion 80 side relative to the mesa portion 94 provided with the second accumulation region 16-2 are preferably dummy trench portions 30. Thereby, fluctuation of threshold voltage and the like can further be reduced.

However, if both a first accumulation region 16-1 and a second accumulation region 16-2 are formed in one mesa portion 94, a trench portion adjacent to the first accumulation region 16-1 may be a gate trench portion 40. In this case, a trench portion adjacent to the second accumulation region 16-2 is preferably a dummy trench portion 30.

Figure 3:
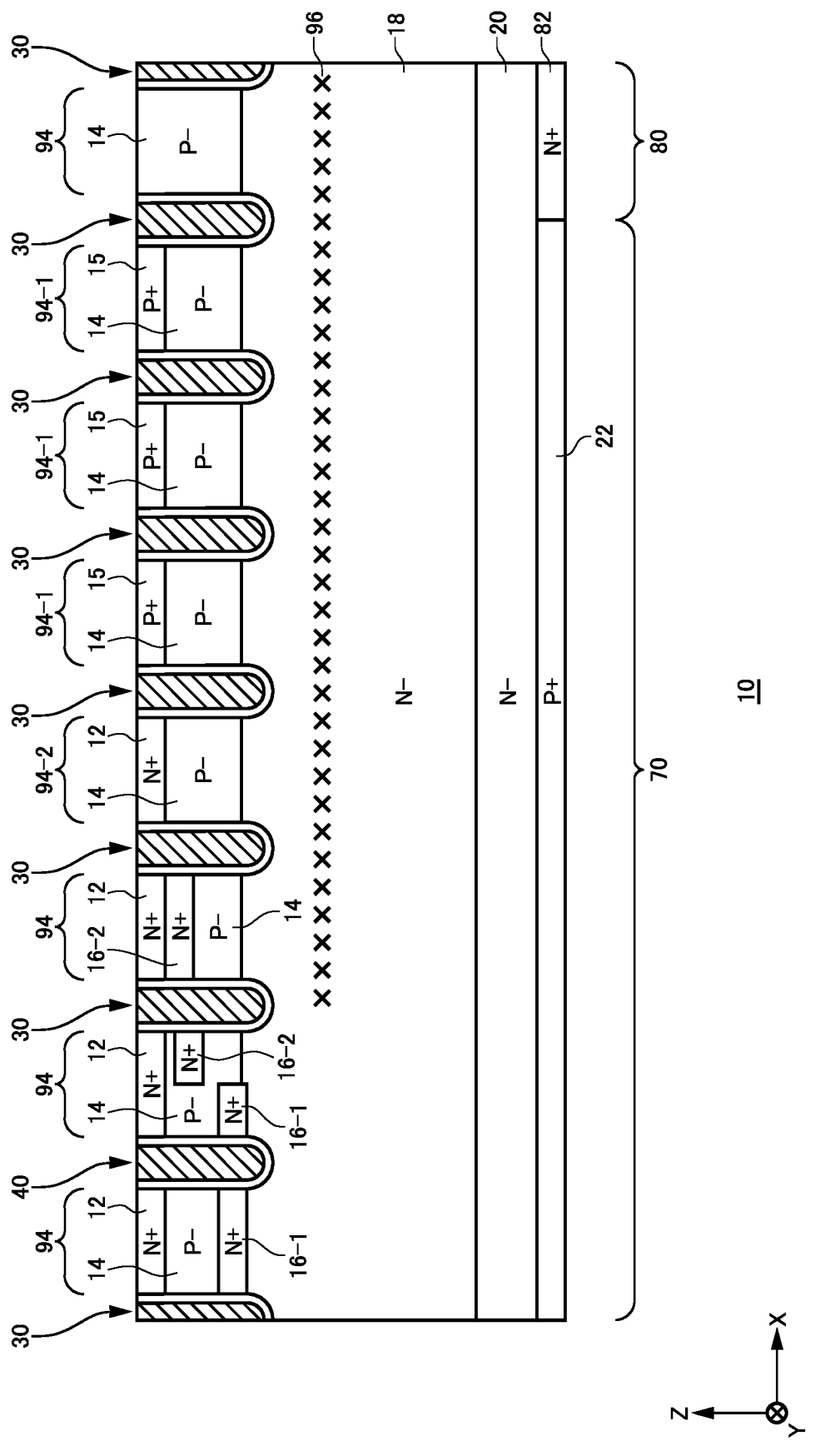
FIG. 3 is a figure showing another example of the cross-section taken along a-a' through a semiconductor substrate 10.

FIG. 3 is a figure showing another example of the cross-section taken along a-a' through the semiconductor substrate 10. In the present example, a lifetime killer 96 is further included in the configuration of the semiconductor substrate 10 shown in FIG. 2. Also, a plurality of boundary mesa portions 94-1 are formed in the semiconductor substrate 10 in FIG. 3. In other respects, the structure may be the same as that in the example shown in FIG. 2.

The lifetime killer 96 is provided on the upper surface side of the semiconductor substrate 10. The upper surface side of the semiconductor substrate 10 refers to the upper surface side at least relative to the middle of the drift region 18 in the depth direction. The lifetime killer 96 may be formed in the entire diode portion 80. Thereby, the carrier lifetime in the diode portion 80 can be adjusted, and for example the diode portion 80 can be allowed to perform soft-recovery operations. The lifetime killer 96 may be any matter as long as it can adjust the carrier lifetime of the semiconductor substrate 10 locally in the depth direction. For example, the lifetime killer 96 is helium locally implanted to the semiconductor substrate 10.

In the transistor portion 70, the lifetime killer 96 of the present example is formed also in a region adjacent to the diode portion 80. However, in the transistor portion 70, the lifetime killer 96 is not formed below a region where the first accumulation region 16-1 is formed. Thereby, the IE effect due to the accumulation regions 16 can be prevented from being cancelled out by the lifetime killer 96.

The lifetime killer 96 of the present example is not formed below mesa portions 94 in which first accumulation regions 16-1 are formed. Also, the lifetime killer 96 may not be formed also below at least one mesa portion 94 adjacent to, on the diode portion 80 side, a mesa portion 94 in which a first accumulation region 16-1 is formed. Thereby, influence of the lifetime killer 96 on the IE effect can be reduced.

The lifetime killer 96 may be formed below at least one boundary mesa portion 94-1 that is closest to the diode portion 80. In the present example, the lifetime killer 96 is formed below all the boundary mesa portions 94-1. Thereby, influence of carriers in the transistor portion 70 on the diode portion 80 can be reduced.

Also, the lifetime killer 96 may be formed also below a mesa portion 94 in which a second accumulation region 16-2 is formed. A region where the lifetime killer 96 is formed may terminate below a region where the second accumulation region 16-2 is formed. Thereby, influence of the lifetime killer 96 on the IE effect and on the diode portion 80 can be reduced.

Figure 4:
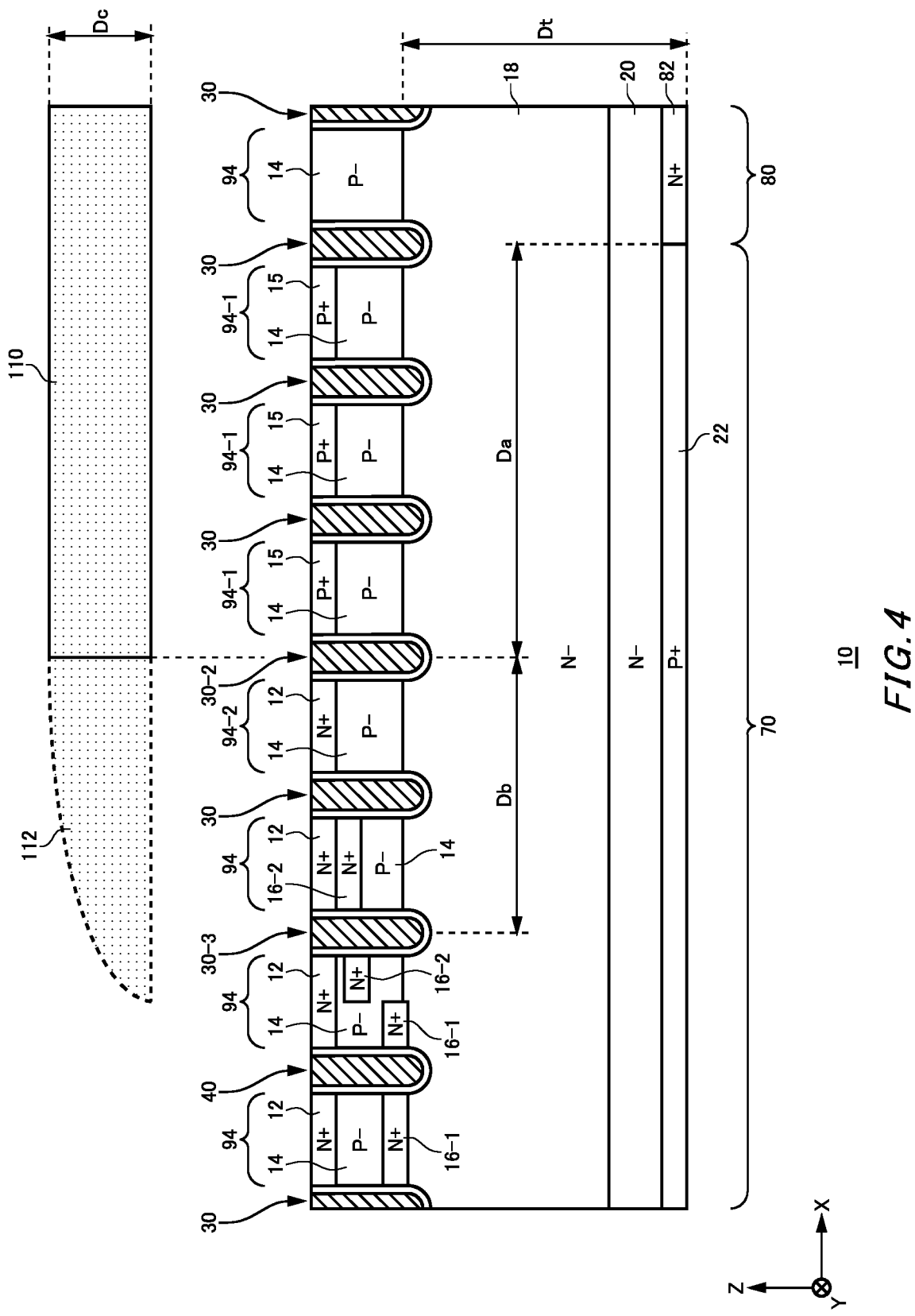
FIG. 4 is a figure for explaining the size of a predetermined part in the semiconductor substrate 10 shown in FIG. 2 or FIG. 3.

FIG. 4 is a figure for explaining the size of a predetermined part in the semiconductor substrate 10 shown in FIG. 2 or FIG. 3. In the X-axis direction, the distance from the boundary between the transistor portion 70 and the diode portion 80 to a dummy trench portion 30-2 between a mesa portion 94-2 having an emitter region 12 and a boundary mesa portion 94-1 is assumed to be Da. The position of a dummy trench portion 30 refers to the position of the center of the dummy trench portion 30 in the X-axis direction.

Also, in the X-axis direction, the distance from the dummy trench portion 30-2 to a dummy trench portion 30-3 is assumed to be Db. The dummy trench portion 30-3 refers to a dummy trench portion 30 that is among dummy trench portions 30 arrayed continuously from the boundary between the transistor portion 70 and the diode portion 80 toward the transistor portion 70 side and is farthest from the boundary between the transistor portion 70 and the diode portion 80. In the Z-axis direction, the distance from the lower surface of the semiconductor substrate 10 to the lower surface of the base regions 14 is assumed to be Dt. In the Z-axis direction, the thickness of the mask 110 is assumed to be Dc.

Here, preferably, 100 μm<Da+Dt<150 μm. If 100 μm<Da+Dt, the distance between the mesa portion 94-2 and the cathode region 82 can be ensured. Because of this, variation in forward voltage at the diode portion 80 due to an accumulation region 16 not being formed in the mesa portion 94-2 can be suppressed. Also, if Da+Dt<150 μm, the size of an ineffective area not functioning as a transistor in the transistor portion 70 can be limited. As one example, Dt may be about 70 μm.

Also, preferably, Db>1.2 Dc. The length of the excess portion 112 of the mask 110 in the X-axis direction depends on a thickness Dc of the mask 110. If Db>1.2 Dc, a trench portion adjacent to a region where the second accumulation region 16-2 is likely to be formed can be allowed to function as a dummy trench portion 30. Because of this, fluctuation of threshold voltage and saturation current can be reduced. Also, Db may be equal to or greater than 6 μm. Also, 2.0 Dc>Db, or 1.5 Dc>Db. Thereby, the size of an ineffective area not functioning as a transistor in the transistor portion 70 can be limited.

Figure 5:
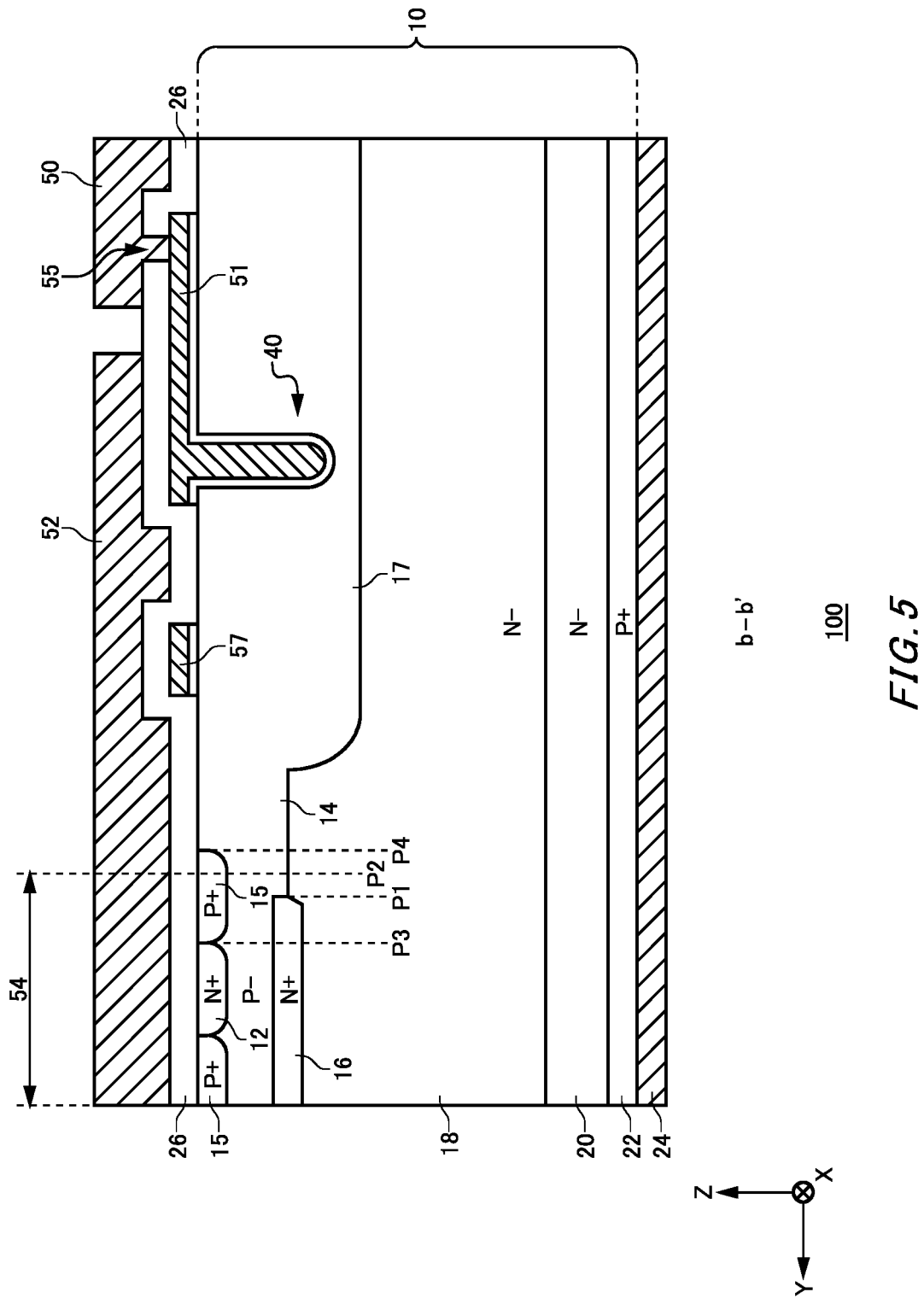
FIG. 5 is a figure showing one example of a cross-section taken along b-b' through the semiconductor device 100 shown in FIG. 1.

FIG. 5 is a figure showing one example of a cross-section taken along b-b' through the semiconductor device 100 shown in FIG. 1. The cross-section taken along b-b' is a plane that is parallel with the Y-Z plane, and passes through a connection portion 57 in a mesa portion 94 on the transistor portion 70 side relative to the boundary mesa portion 94-1. An accumulation region 16 is formed in the mesa portion 94. Also in FIG. 5, the position of a contact hole 54 formed facing the cross-section is indicated with dotted lines.

As shown in FIG. 1, at the upper surface of the semiconductor substrate 10, the mesa portion 94 has emitter regions 12 and contact regions 15 alternately along the extension direction of trench portions. Also, an accumulation region 16 is formed at the lower surface of the base region 14.

Also, an end portion position of an outermost accumulation region 16 in the Y-axis direction (in other words, closest to the gate electrode 50) is assumed to be P1. An outermost end portion position of the contact hole 54 in the Y-axis direction is assumed to be P2. An end portion position of an outermost emitter region 12 in the Y-axis direction on the gate electrode 50 side is assumed to be P3. An end portion position of an outermost contact region 15 in the Y-axis direction on the gate electrode 50 side is assumed to be P4.

The accumulation region 16 is preferably formed to reach an outer position relative to an end portion of the outermost emitter region 12 in the Y-axis direction. That is, the end portion position P1 of the accumulation region 16 is preferably arranged at an outer position relative to the end portion position P3 of the emitter region 12. Thereby, the IE effect in the accumulation region 16 can be enhanced.

Also, the contact hole 54 is preferably formed to reach an outer position relative to the accumulation region 16 in the Y-axis direction. That is, the end portion position P2 of the contact hole 54 is preferably arranged at an outer position relative to the end portion position P1 of the accumulation region 16. Thereby, at the time of turn-off of the semiconductor device 100, holes can be extracted efficiently from an outer position relative to the accumulation region 16.

Also, an outermost contact region 15 in the Y-axis direction is preferably formed to reach an outer position relative to the contact hole 54. That is, the end portion position P4 of the contact region 15 is preferably arranged at an outer position relative to the end portion position P2 of the contact hole 54. Thereby, at the time of turn-off of the semiconductor device 100, holes can be extracted efficiently from an outer position relative to the accumulation region 16.

Also, the distance from the end portion position P3 of the emitter region 12 to the end portion position P1 of the accumulation region 16 may be shorter than the distance from the end portion position P1 of the accumulation region 16 to the end portion position P4 of the contact region 15. Thereby, inhibition of extraction of holes by the accumulation region 16 can be suppressed. Also, electric field crowding at an end portion of the accumulation region 16 can be relaxed. The distance between the end portion positions P3 and P1 is preferably shorter than the distance from the end portion position P1 of the accumulation region 16 to the end portion position P2 of the contact hole 54.

As one example, the distance from the end portion position P3 of the emitter region 12 to the end portion position P1 of the accumulation region 16 is equal to or shorter than 12 μm. Also, the distance from the end portion position P1 of the accumulation region 16 to the end portion position P2 of the contact hole 54 is equal to or shorter than 20 μm. Also, the distance from the end portion position P2 of the contact hole 54 to the end portion position P4 of the contact region 15 is equal to or shorter than 1 μm.

In FIG. 1 to FIG. 4, the semiconductor device 100 including the diode portion 80 is explained. In contrast to this, the semiconductor device 100 shown in FIG. 5 may or may not include a diode portion 80. Even if a diode portion 80 is not included, the semiconductor device 100 can attain the above-mentioned effects.

Also, at the upper surface of the semiconductor substrate 10, a base region 14 is formed between the outermost contact region 15 and the well region 17. That is, a region with relatively high resistance is arranged outside the contact region 15. Thereby, at the time of reverse recovery, carriers to go around from the transistor portion 70 into the diode portion 80 can be reduced. Accordingly, concentration of carriers at an end portion of a contact region 15 in the diode portion 80 can be suppressed, and lowering of the withstand capability of the diode portion 80 can be suppressed. In the Y-axis direction, the length of the base region 14 between the contact region 15 and the well region 17 may be equal to or longer than 10 μm and equal to or shorter than 50 μm.

Figure 6:
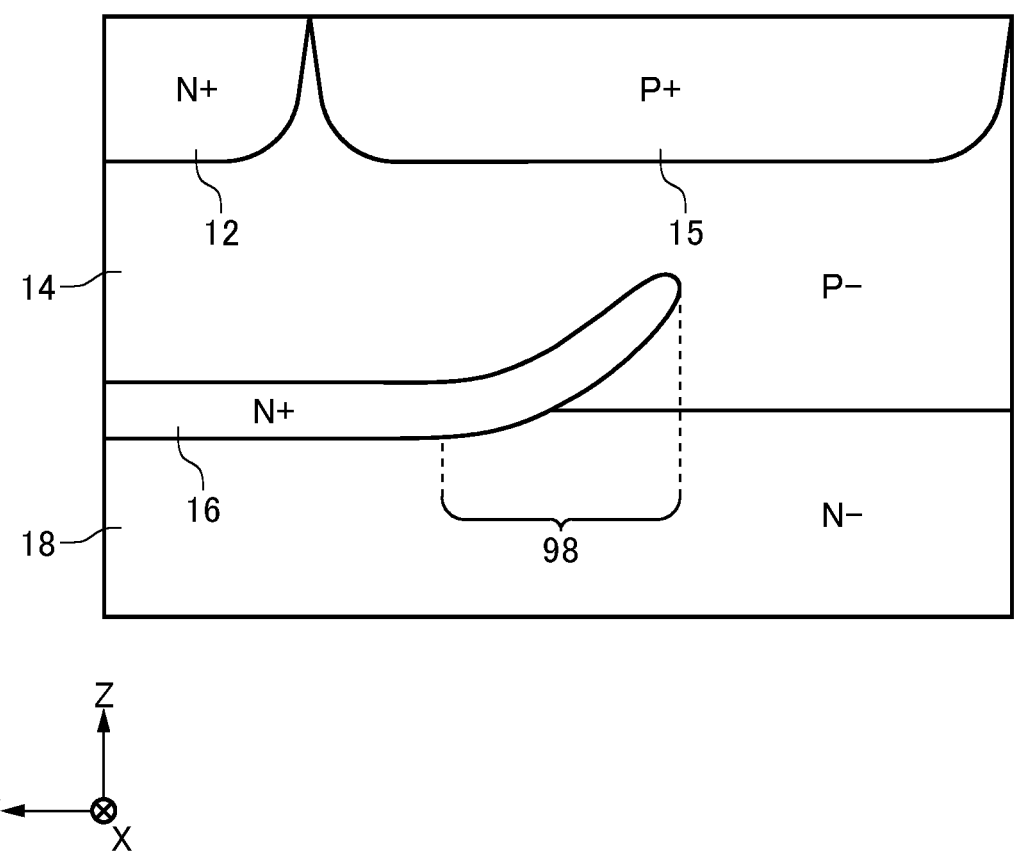
FIG. 6 is an enlarged figure showing the portion near an end portion 98 of an accumulation region 16 in the cross-section shown in FIG. 5.

FIG. 6 is an enlarged figure showing the portion near an end portion 98 of an accumulation region 16 in the cross-section shown in FIG. 5. The end portion 98 of the accumulation region 16 may be formed such that the depth of part thereof decreases as the distance of the part from its outermost edge in the Y-axis direction decreases. For example, the edge of the accumulation region 16 in the Y-axis direction is formed at a position shallower than the accumulation region 16 below the emitter region 12. The edge of the accumulation region 16 may be formed at a position not contacting the drift region 18. The edge of the accumulation region 16 may be provided at a position shallower than the middle of the base region 14 in the Z-axis direction.

With a shape like this, at the turn-off of the semiconductor device 100, holes can be extracted efficiently at the portion near the end portion 98 of the accumulation region 16. The accumulation region 16 of the present example can be formed readily using the mask 110 having the excess portion 112 explained with reference to FIG. 2. Also, the shape of the end portion 98 of the accumulation region 16 can be controlled by adjusting the shape of the excess portion 112 of the mask 110. As one example, the bake temperature or bake time for the mask 110, or the thickness or material of the mask 110 may be adjusted.

Figure 7:
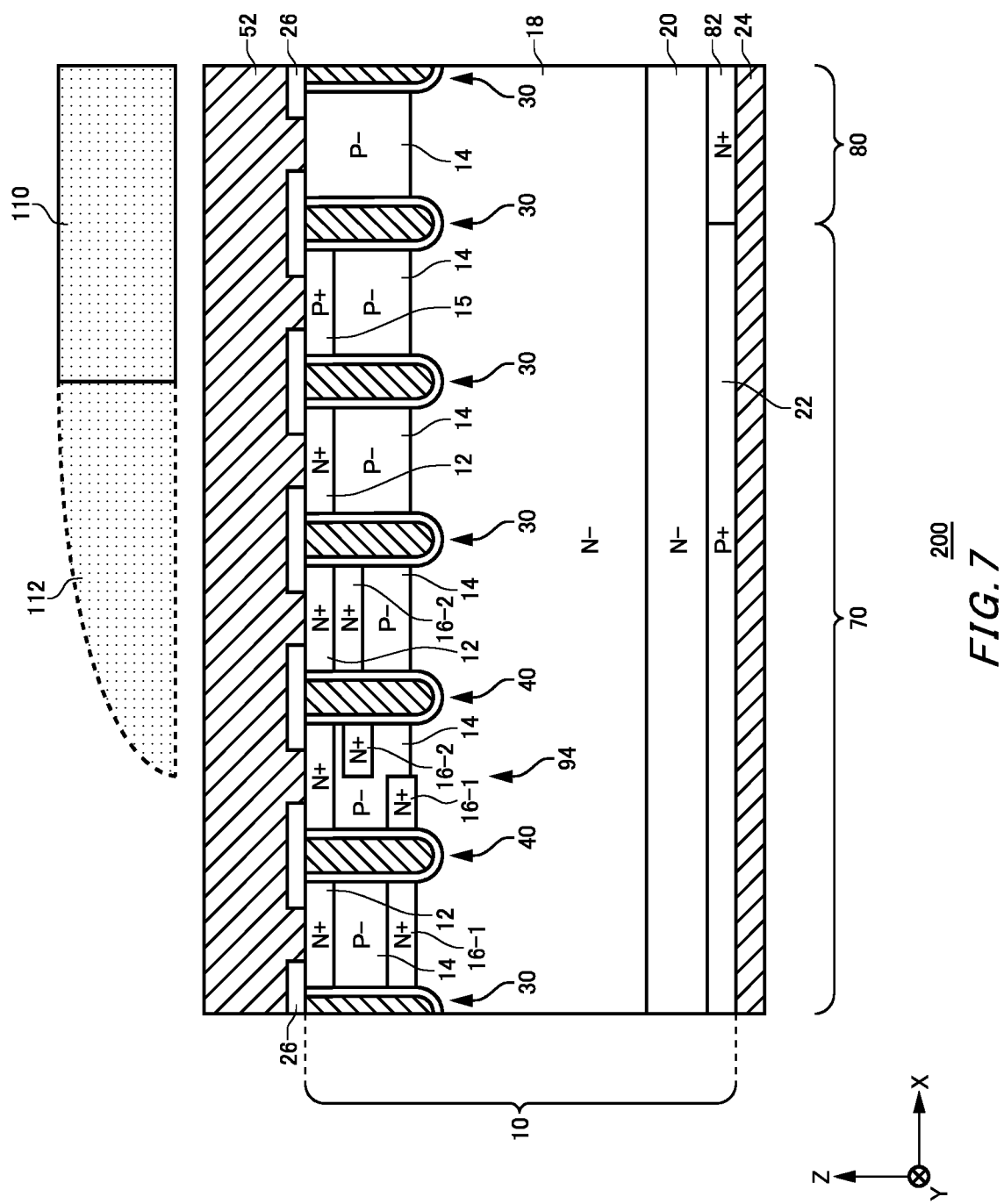
FIG. 7 is a figure showing one example of a semiconductor device 200 according to a comparative example.

FIG. 7 is a figure showing one example of a semiconductor device 200 according to a comparative example. In the semiconductor device 200 of the present example, a gate trench portion 40 is formed adjacent to a second accumulation region 16-2. As mentioned above, if a gate trench portion 40 is provided adjacent to a second accumulation region 16-2, fluctuation of threshold voltage Vth and saturation current at the transistor portion 70 increases. In contrast to this, because according to the semiconductor device 100, a dummy trench portion 30 is provided adjacent to a second accumulation region 16-2, fluctuation of threshold voltage Vth and saturation current at the transistor portion 70 can be reduced.

Figure 8:
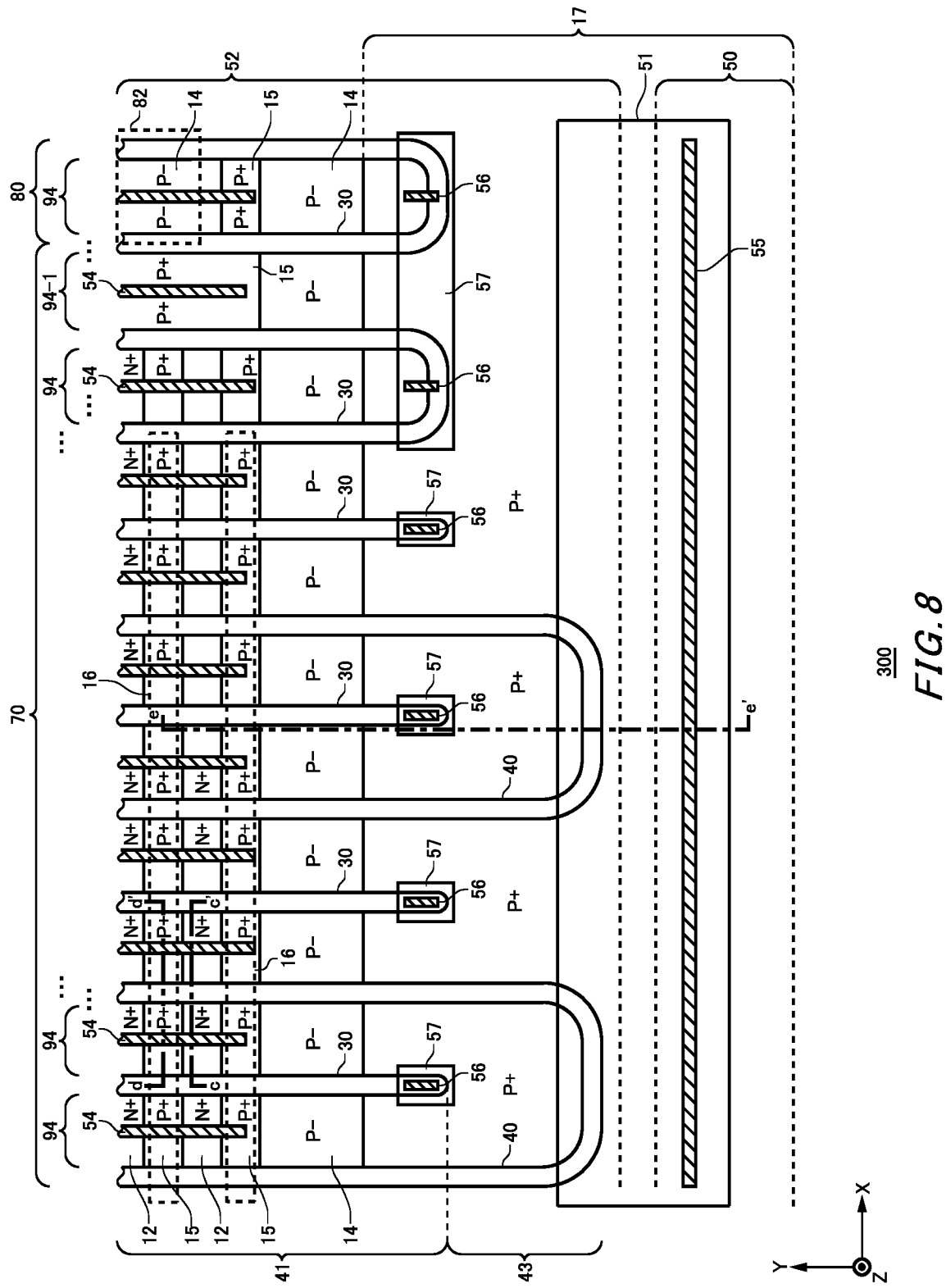
FIG. 8 is a top view showing one example of a semiconductor device 300.

FIG. 8 is a top view showing one example of a semiconductor device 300. The semiconductor device 300 is different in terms of the structure of accumulation regions 16 from the semiconductor device 100 of the respective aspects explained with reference to FIG. 1 to FIG. 6. In other respects, the structure may be the same as that of the semiconductor device 100 of any of the aspects.

The accumulation regions 16 in the semiconductor device 300 are provided in at least partial regions below contact regions 15, but not provided in at least partial regions below emitter regions 12. The accumulation regions 16 of the present example have strip shapes extending along the X-axis direction. The strip-shaped accumulation regions 16 are provided discretely along the Y-axis direction. As one example, the respective strip-shaped accumulation regions 16 are formed in a range that overlaps the contact regions 15 but does not overlap the emitter regions 12. In the present example, the widths of the strip-shaped accumulation regions 16 in the Y-axis direction are smaller than the widths of the contact regions 15 in the Y-axis direction.

Figure 9:
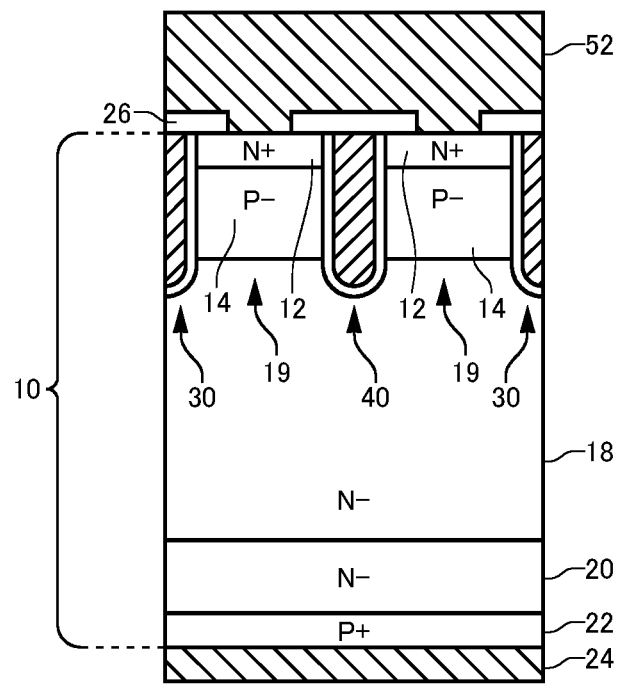
FIG. 9 is a figure showing one example of a cross-section taken along c-c' in FIG. 8.

FIG. 9 is a figure showing one example of a cross-section taken along c-c' in FIG. 8. The cross-section taken along c-c' is a plane parallel with the X-Z plane and passes through emitter regions 12. As mentioned above, in at least partial regions below the emitter regions 12, carrier passage regions 19 in which accumulation regions 16 are not formed are provided.

The carrier passage regions 19 are regions where the hole mobility is greater than that in the accumulation regions 16. The carrier passage regions 19 of the present example refer to regions near the interface where base regions 14 that remained without accumulation regions 16 being formed therein and a drift region 18 contacts. The carrier passage regions 19 may be provided over the entire width of the mesa portions 94 in the X-axis direction. In another example, the carrier passage regions 19 may include an N-type region with a doping concentration lower than that of the accumulation regions 16, and higher than that of the drift region 18. In this case, the concentration of N-type impurities in the carrier passage regions 19 may be equal to or lower than 1/10 or 1/100 of the concentration of N-type impurities in the accumulation regions 16.

Figure 10:
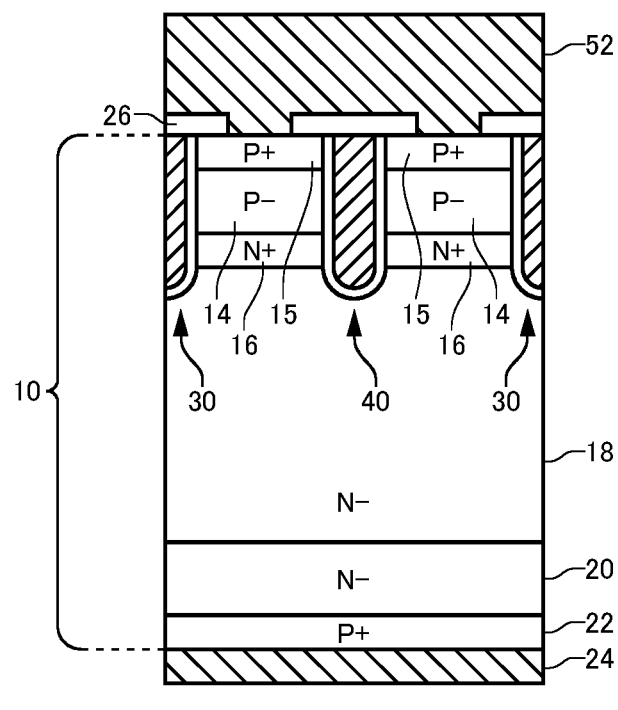
FIG. 10 is a figure showing one example of a cross-section taken along d-d' in FIG. 8.

FIG. 10 is a figure showing one example of a cross-section taken along d-d' in FIG. 8. The cross-section taken along d-d' is a plane that is parallel with the X-Z plane and passes through contact regions 15. As mentioned above, accumulation regions 16 are formed in at least partial regions below the contact regions 15.

Figure 11:
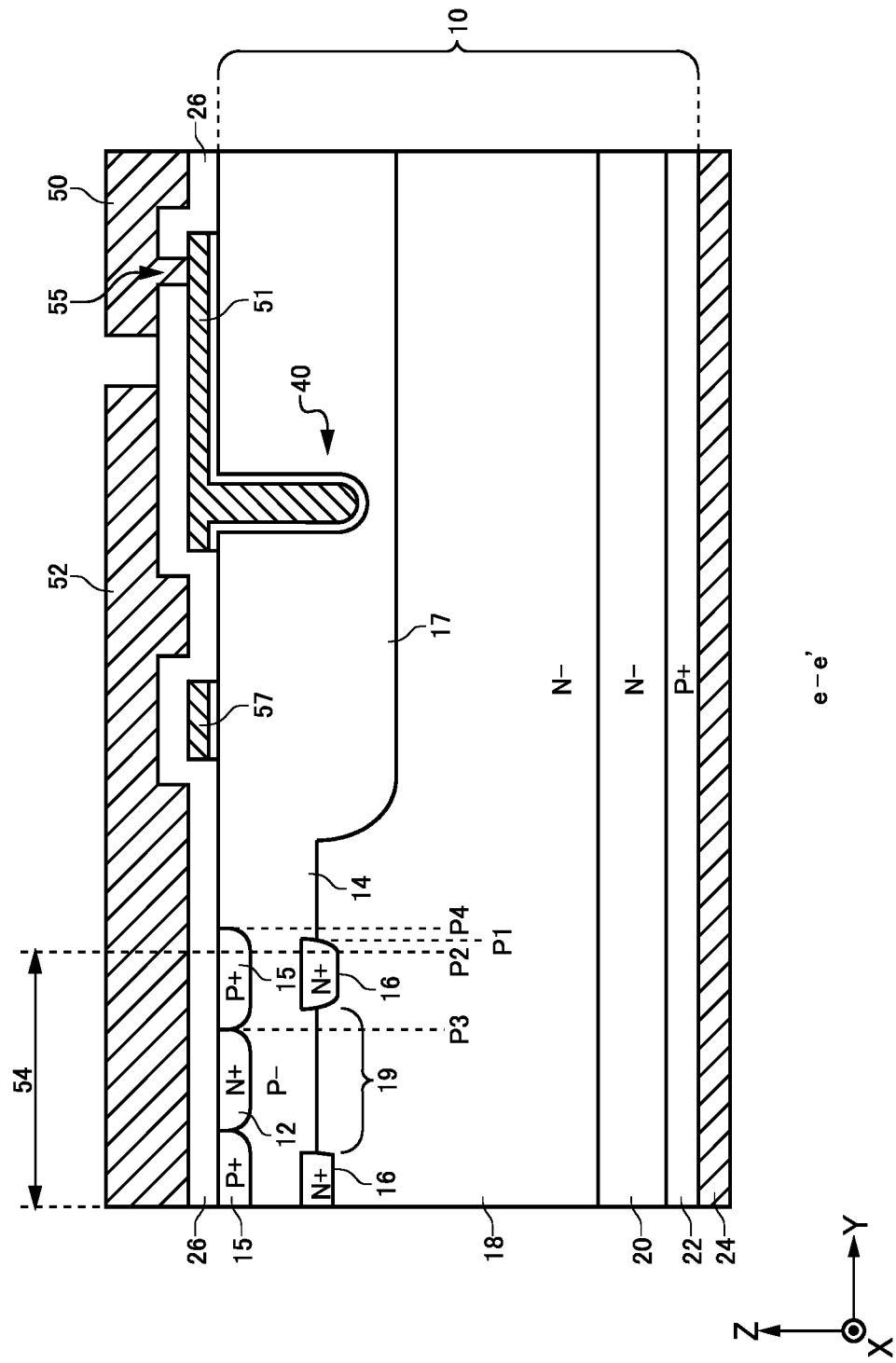
FIG. 11 is a figure showing one example of a cross-section taken along e-e' in FIG. 8.

FIG. 11 is a figure showing one example of a cross-section taken along e-e' in FIG. 8. The cross-section taken along e-e' is a plane that is parallel with the Y-Z plane and passes through a connection portion 57. As mentioned above, a carrier passage region 19 is provided below an emitter region 12, and accumulation regions 16 are provided below contact regions 15.

By providing the carrier passage regions 19, excessive accumulation of holes below a base region 14 can be prevented. Because of this, lowering of the withstand capability resulting from the accumulation regions 16 being provided can be suppressed.

In the present example, the carrier passage region 19 is provided over the entire region below the emitter region 12. That is, the width of the carrier passage region 19 in the Y-axis direction is equal to or greater than the width of the emitter region 12 in the Y-axis direction.

The width of the carrier passage region 19 in the Y-axis direction may be greater than the width of the emitter region 12 in the Y-axis direction. In this case, the carrier passage region 19 is provided also below end portions of the contact regions 15 in addition to the region below the emitter region 12. Thereby, even if dripping of a resist used when discretely forming accumulation regions 16 occurs, and the accumulation regions 16 are formed at shallow positions unintentionally, it is possible to suppress shallow accumulation regions 16 being provided below the emitter region 12.

In the present example, an end portion position of an accumulation region 16 that is among a plurality of accumulation regions 16 formed into strip shapes and is outermost in the Y-axis direction (in other words, closest to the gate electrode 50) is assumed to be P1. The other end portion positions P2, P3, P4 are the same as those in the example of FIG. 5.

The accumulation region 16 of the present example is formed to reach an outer position relative to the end portion position P2 of the contact hole 54 in the Y-axis direction. That is, the end portion position P1 of the accumulation region 16 is arranged at an outer position relative to the end portion position P2 of the contact hole 54. Because in the present example, the carrier passage region 19 is provided, lowering of the withstand capability can be suppressed even if the accumulation region 16 is formed to reach an outer position relative to the contact hole 54. Also, by forming the accumulation region 16 to reach an outer position relative to the contact hole 54, a certain amount of carriers can be accumulated also in an end portion region.

The end portion position P1 of the accumulation region 16 may be arranged at an inner position relative to the end portion position P4 of the contact region 15. Thereby, inhibition, by the accumulation region 16, of extraction of holes from the end portion region at the time of turn-off can be suppressed.

Figure 12:
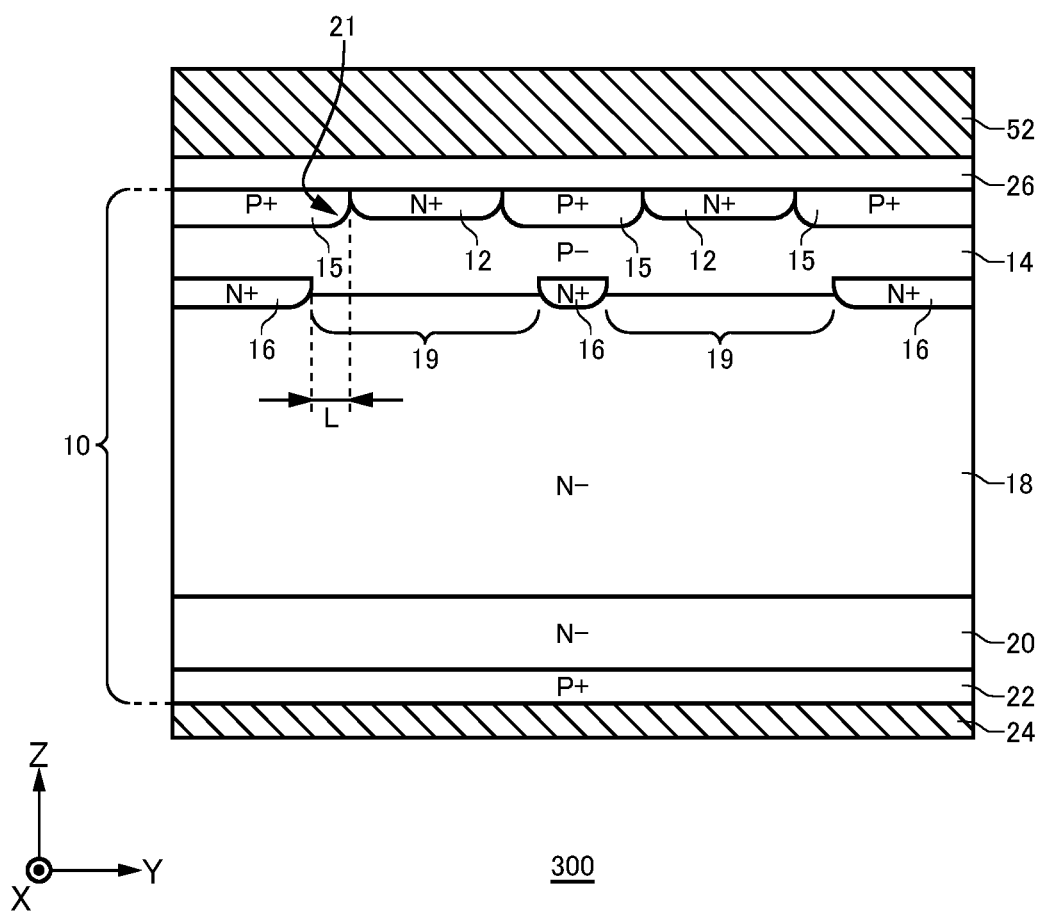
FIG. 12 is a figure showing one example of a cross-section of a mesa portion 94 on a plane parallel with the Y-Z plane.

FIG. 12 is a figure showing one example of a cross-section of a mesa portion 94 on a plane parallel with the Y-Z plane. At the upper surface of the mesa portion 94, contact regions 15 and emitter regions 12 are arranged alternately along the Y-axis direction.

As mentioned above, a carrier passage region 19 is provided also below an end portion 21 that is part of a contact region 15 and adjacent to an emitter region 12. A length L, in the Y-axis direction, of a portion of the carrier passage region 19 that overlaps the one end portion 21 of the contact region 15 may be equal to or greater than 10% or 20% of the width of the contact region 15 in the Y-axis direction. The length L may be equal to or less than 30% of the width of the contact region 15 in the Y-axis direction.

Figure 13:
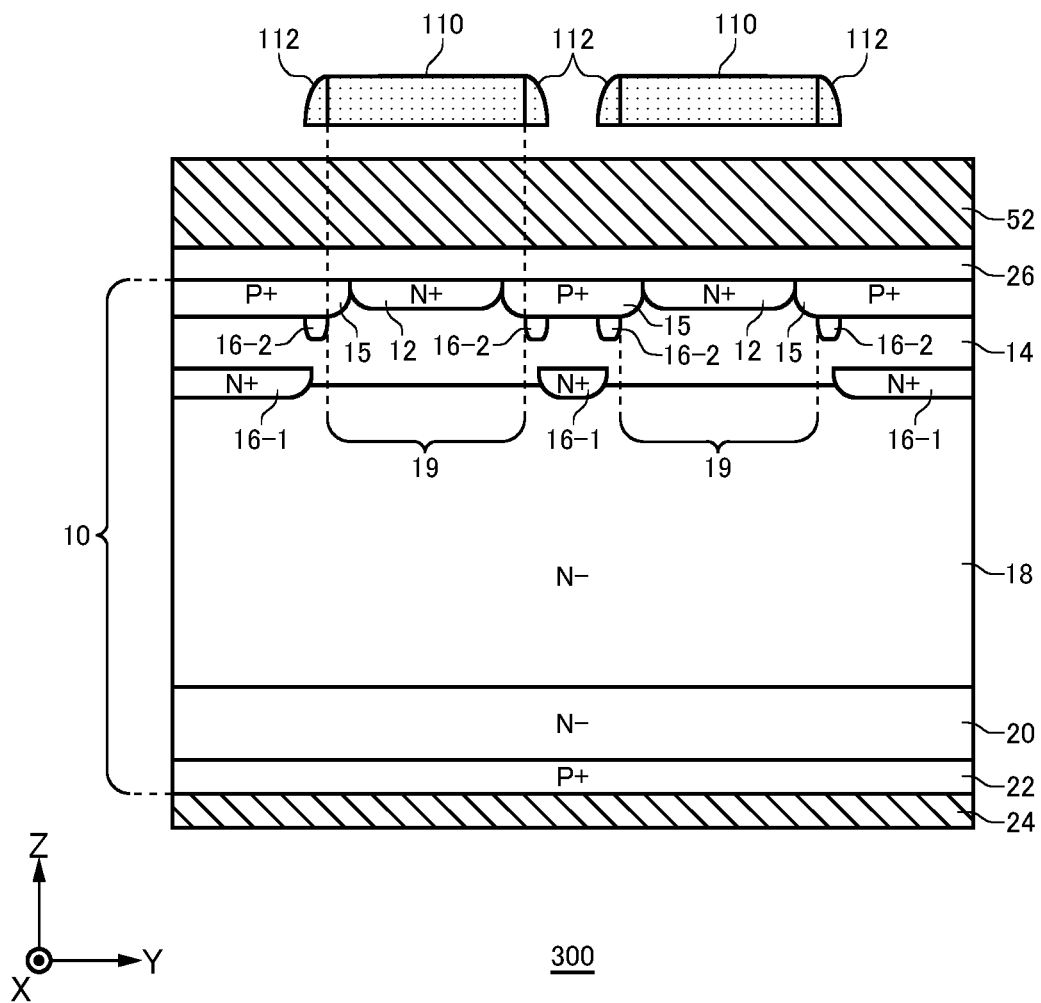
FIG. 13 is a figure showing another example of the cross-section of a mesa portion 94 on the plane parallel with the Y-Z plane.

FIG. 13 is a figure showing another example of the cross-section of a mesa portion 94 on the plane parallel with the Y-Z plane. Accumulation regions 16 of the present example include first accumulation regions 16-1 formed at a predetermined depth position and second accumulation regions 16-2 formed at a position shallower than the first accumulation regions 16-1. The second accumulation regions 16-2 are closer to emitter regions 12 in the Y-axis direction than the first accumulation region 16-1 are. That is, in the Y-axis direction, the second accumulation regions 16-2 are arranged between the first accumulation regions 16-1 and the emitter regions 12.

The first accumulation regions 16-1 are arranged between the base region 14 and the drift region 18. The second accumulation regions 16-2 may be in contact with contact regions 15 or separated from the contact regions 15. Also, at least some of the second accumulation regions 16-2 may be formed in the contact regions 15. Also, the first accumulation regions 16-1 and the second accumulation regions 16-2 may be formed continuously or formed separate from each other.

As mentioned above, if an excess portion 112 is generated to the mask 110 used to form accumulation regions 16, shallow second accumulation regions 16-2 are formed below the excess portion 112 in some cases. In the present example, both the first accumulation regions 16-1 and the second accumulation region 16-2 are formed below the contact regions 15, and not formed below the emitter regions 12. Because of this, even if the second accumulation regions 16-2 are formed, characteristics such as the threshold voltage of the semiconductor device 100 are not affected.

The mask 110 is preferably arranged such that an end portion of the mask 110 and an end portion of a contact region 15 overlap. Thereby, even if an excess portion 112 is generated to the mask 110, a second accumulation region 16-2 formed below the excess portion 112 can be arranged so as not to overlap an emitter region 12.

Figure 14:
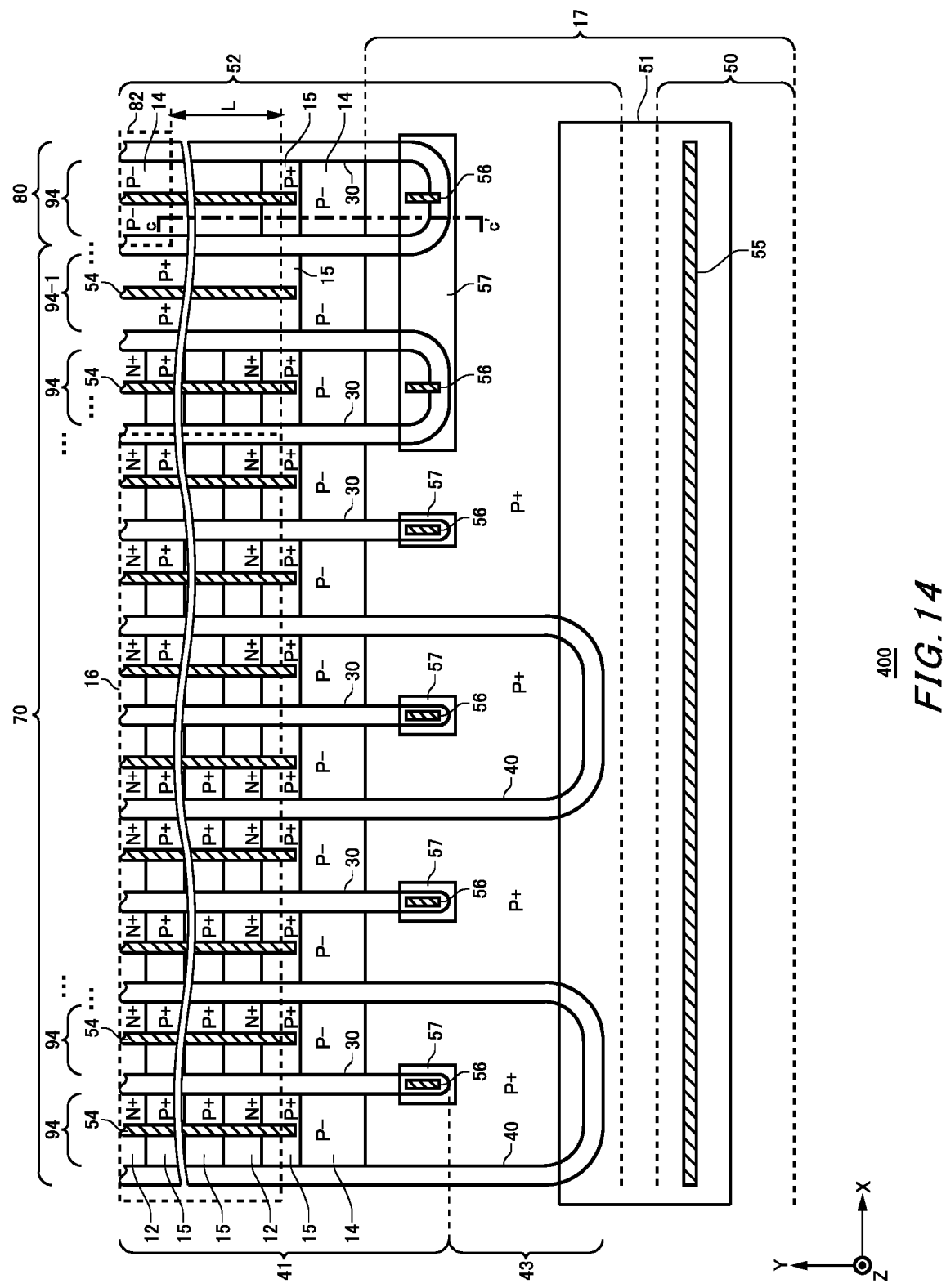
FIG. 14 is a top view showing one example of a semiconductor device 400.

FIG. 14 is a top view showing one example of a semiconductor device 400. In the diode portion 80 of the present example, an outer end portion of the N+-type cathode region 82 is shifted backward in the Y-axis positive direction as compared with any of the semiconductor devices shown in FIG. 1 to FIG. 13. Although collector regions 22 are not illustrated in FIG. 14, the transistor portion 70 and the diode portion 80 may have collector regions 22. The transistor portion 70 of the present example has the collector region 22 over the entire surface on the lower surface side in a similar manner to that for the semiconductor device 100, the semiconductor device 200 or the semiconductor device 300. In contrast to this, the diode portion 80 of the present example has the collector region 22 at part on the lower surface side, and the cathode region 82 at another part on the lower surface side. That is, on the lower surface side of the diode portion 80 of the present example, the cathode region 82 is provided in a region not provided with the collector region 22.

An inner end portion of the collector region 22 of the diode portion 80 may be positioned at an inner position relative to an outer end portion of the accumulation region 16 of the transistor portion 70, and may be positioned at an inner position relative to an outer end portion of an outermost emitter region 12 in the Y-axis direction in the transistor portion 70. In the present example, the inner end portion of the collector region 22 of the diode portion 80 coincides with an outer end portion of the cathode region 82 of the diode portion 80. In the present example, the length, in the Y-axis direction, from the inner end portion of the collector region 22 of the diode portion 80 to the outer end portion of the accumulation region 16 of the transistor portion 70 is referred to as L. In one example, the length L may be 200 μm.

Figure 15:
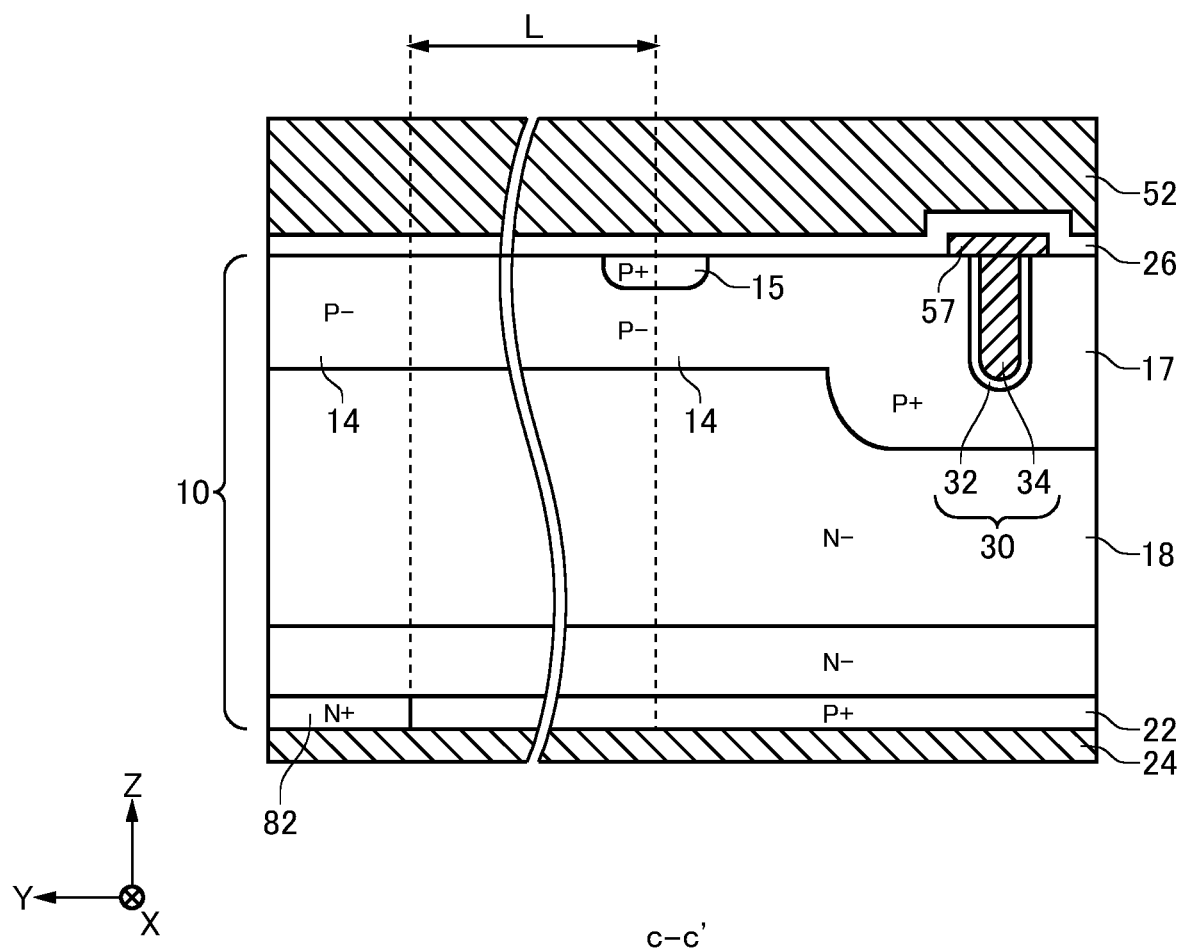
FIG. 15 is a figure showing one example of a cross-section taken along c-c' through the semiconductor device 400 shown in FIG. 14.

FIG. 15 is a figure showing one example of a cross-section taken along c-c' through the semiconductor device 400 shown in FIG. 14. FIG. 15 shows a Y-Z cross-section in the diode portion 80. A dotted line near a contact region 15 indicates the position, in the Y-axis direction, of the outer end portion of the accumulation region 16 of the transistor portion 70 in FIG. 14. In contrast to this, the boundary between the collector region 22 and the cathode region 82 is positioned in the Y-axis positive direction shifted by the length L from the outer end portion of the accumulation region 16 of the transistor portion 70.

Because in the present example, the P+-type collector region 22 is extended in the diode portion 80, it becomes easier to inject holes from the collector region 22 into the drift region 18. Thereby, for example, if series arm short-circuit in which an upper arm and a lower arm that are connected in series are simultaneously turned on occurs, avalanche breakdowns at the rear surface can be prevented by injecting holes from the rear surface side. Also, although avalanche breakdowns are likely to occur due to electric field crowding at a curved portion of the well region 17 shown in FIG. 15, the avalanche breakdowns can be suppressed by injecting holes from the rear surface side.

Figure 16:
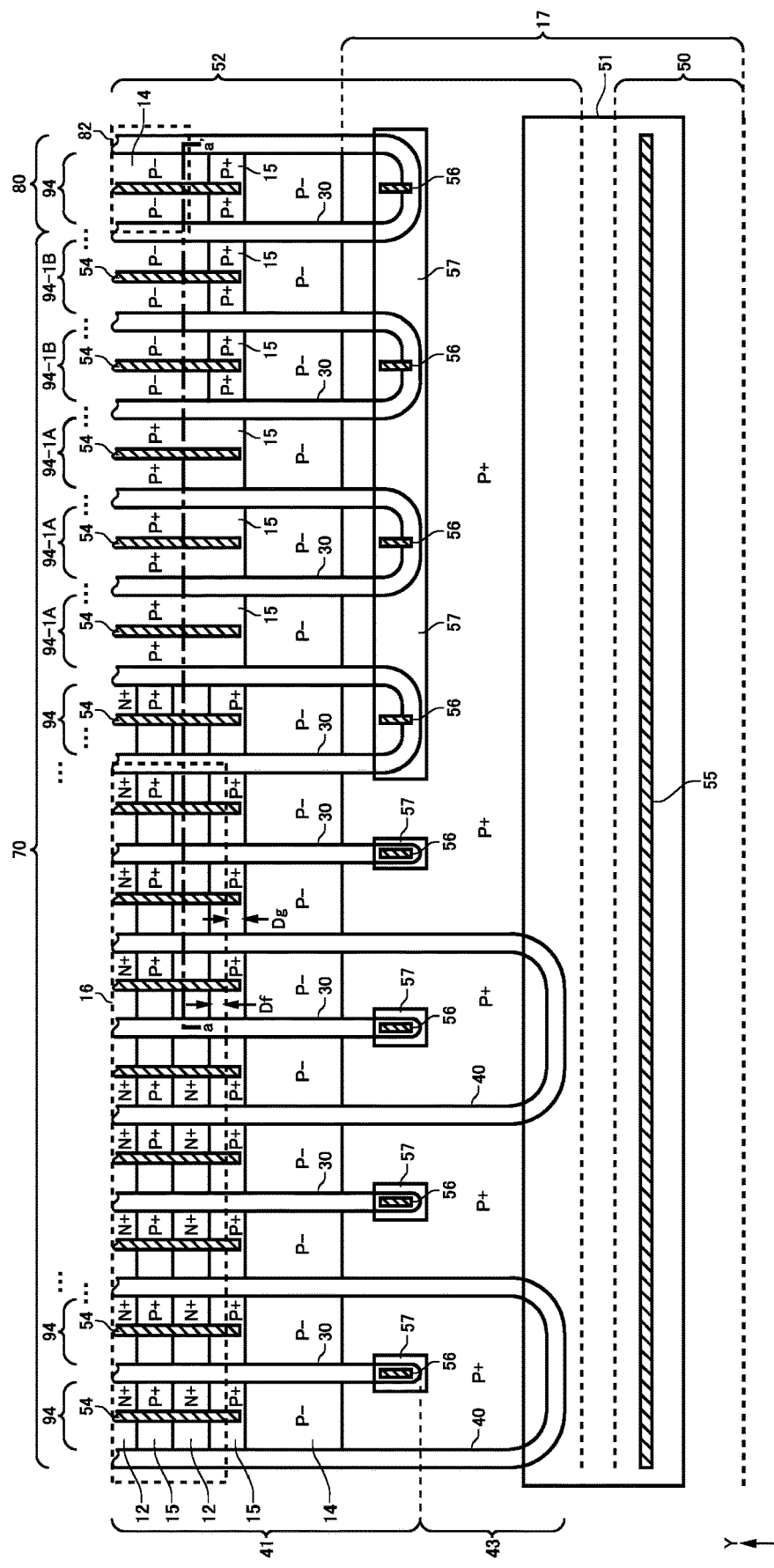
FIG. 16 is a top view showing one example of a semiconductor device 500.

FIG. 16 is a top view showing one example of a semiconductor device 500. The semiconductor device 500 includes boundary mesa portions 94-1 having structures different from those in the semiconductor devices 100 of the respective aspects explained with reference to FIG. 1 to FIG. 6. In other respects, the structure of the semiconductor device 500 may be the same as that of the semiconductor device 100 of any of the aspects.

The boundary mesa portions 94-1 include, on the transistor portion 70 side, one or more boundary mesa portions 94-1A in which the areas of contact regions 15 exposed to the upper surface of the semiconductor substrate are greater than the exposed areas of base regions 14. The boundary mesa portions 94-1 may include a plurality of boundary mesa portions 94-1A. Also, the boundary mesa portions 94-1 include, on the diode portion 80 side, one or more boundary mesa portions 94-1B in which the areas of contact regions 15 exposed to the upper surface of the semiconductor substrate are smaller than the exposed areas of base regions 14. The boundary mesa portions 94-1 may include a plurality of boundary mesa portions 94-1B.

A mesa portion 94 that is among the mesa portions 94 of the transistor portion 70 and is positioned closest to the diode portion 80 is adjacent to a boundary mesa portion 94-1A along the array direction. A mesa portion 94 that is among the mesa portions 94 of the diode portion 80 and is positioned closest to the transistor portion 70 is adjacent to a boundary mesa portion 94-1B along the array direction. A boundary mesa portion 94-1A may be sandwiched by dummy trench portions 30. A boundary mesa portion 94-1B may be sandwiched by dummy trench portions 30.

The distance from the end portion position P3 of the emitter region 12 to the end portion position P1 of the accumulation region 16 shown in FIG. 5 is assumed to be Df. Also, the distance from the end portion position P1 of the accumulation region 16 to the end portion position P4 of the contact region 15 is assumed to be Dg.

Figure 17:
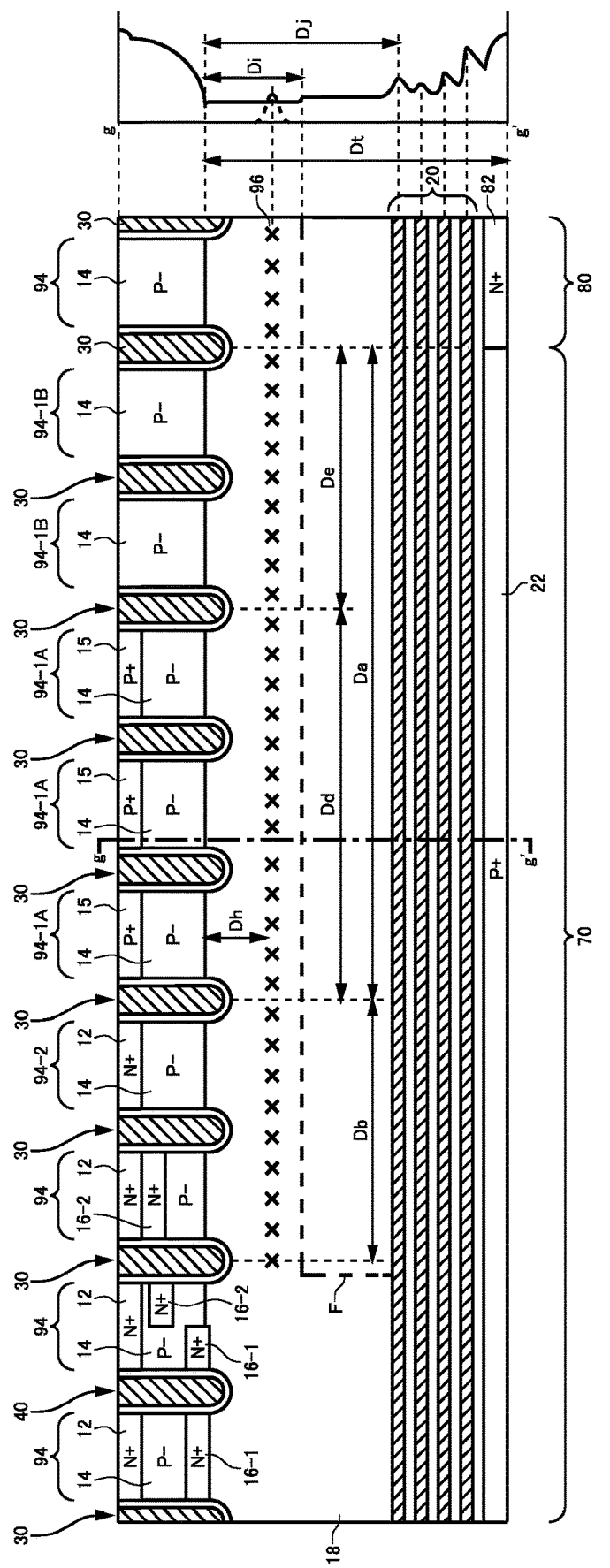
FIG. 17 is a figure showing one example of a cross-section taken along a-a' through the semiconductor device 500 shown in FIG. 16.

FIG. 17 is a figure showing one example of a cross-section taken along a-a' through the semiconductor device 500 shown in FIG. 16. The cross-section taken along a-a' is a cross-section that is parallel with the X-Z plane and passes through an emitter region 12 of the transistor portion 70. In FIG. 17, illustration of the emitter electrode 52 and the collector electrode 24 is omitted. The boundary mesa portions 94-1A and the boundary mesa portions 94-1B include the collector region 22 at corresponding lower surfaces (in other words, rear surfaces) of the semiconductor substrate. The collector region 22 may extend from the transistor portion 70. Also, in FIG. 17, distribution examples of the doping concentration (/cm$^3$) and defect concentration (/cm$^3$) in a cross-section taken along g-g' is shown as well. About the concentration distributions, the solid line indicates the doping concentration, and the dotted line indicates the defect concentration.

In the X-axis direction, the distance from a dummy trench portion 30-2 between a mesa portion 94-2 having an emitter region 12 and a boundary mesa portion 94-1A to a dummy trench portion 30 between a boundary mesa portion 94-1A and a boundary mesa portion 94-1B is assumed to be Dd. The distance from the dummy trench portion 30 between the boundary mesa portion 94-1A and the boundary mesa portion 94-1B to a boundary between the transistor portion 70 and the diode portion 80 is assumed to be De. The position of a dummy trench portion 30 refers to the position of the center of the dummy trench portion 30 in the X-axis direction. Also, in the Z-axis direction, the distance from the lower surface of the semiconductor substrate 10 to the lower surface of the base regions 14 is assumed to be Dt.

The distance Dd may be longer than the distance De. If the transistor portion 70 is turned off, minority carriers can be extracted effectively, and turn-off destruction can be prevented. The minority carriers are holes in the present example.

On the other hand, the distance De may be longer than the distance Dd. If the diode portion 80 is in its conductive state, minority carriers are injected from both the boundary mesa portions 94-1A and the boundary mesa portions 94-1B. The percentage of the area of a contact region 15 with a concentration higher than that of a base region 14 in a boundary mesa portion 94-1A is greater than that in a boundary mesa portion 94-1B. Because of this, if the diode portion 80 is in its conductive state, the concentration of minority carriers at the boundary mesa portions 94-1 and an end of the diode portion 80 in the trench portion array direction becomes high, and it becomes likely for destruction at the time of reverse recovery to occur. By making the distance De longer than the distance Dd, the boundary mesa portions 94-1A and the cathode region 82 can be separated, and increase in the concentration of minority carriers can be suppressed.

The sum of the distance Dd and the distance De may match the distance Da (Dd+De=Da). The sum of the distance Da and the distance Dt (Da+Dt) may be greater than 100 μm and shorter than 150 μm.

The sum of the distance Dd and the distance De, or the distance Da, may be greater than the distance Df from the end portion position P3 of the emitter region 12 to the end portion position P1 of the accumulation region 16. Alternatively, the sum of the distance Dd and the distance De, or the distance Da, may be greater than Dg which is the distance form the end portion position P1 of the accumulation region 16 to the end portion position P4 of the contact region 15. Thereby, if the transistor portion 70 is turned off, extraction of minority carriers can be performed effectively. Also, at the time when the diode portion 80 is conductive, injection and accumulation of minority carriers of the boundary mesa portions 94-1 or the diode portion 80 can be suppressed, and reverse recovery destruction can be prevented.

The sum of the distance Dd and the distance De, or the distance Da, may be greater than the distance Dh from the bottom surfaces of the base regions 14 of the boundary mesa portions 94-1 to the peak position of the defect concentration of the lifetime killer 96. Furthermore, the distance Dd or distance De may be longer than the distance Dh from the bottom surfaces of the base regions 14 of the boundary mesa portions 94-1A or the boundary mesa portions 94-1B to the peak position of the defect concentration of the lifetime killer 96. Thereby, if the transistor portion 70 is turned off, extraction of minority carriers can be performed effectively. Also, at the time when the diode portion 80 is conductive, injection and accumulation of minority carriers of the boundary mesa portions 94-1 or the diode portion 80 can be suppressed, and reverse recovery destruction can be prevented.

The sum of the distance Dd and the distance De, or the distance Da, may be greater than the distance Di from the bottom surfaces of the base regions 14 of the boundary mesa portions 94-1 to the position where the doping concentration becomes higher than the doping concentration of the semiconductor substrate. Furthermore, the sum of the distance Dd and the distance De, or the distance Da, may be greater than the distance Dj from the bottom surfaces of the base regions 14 of the boundary mesa portions 94-1 to the peak position which is among a plurality of peak positions of the doping concentration in the buffer region 20 and is closest to the upper surface of the semiconductor substrate. Thereby, if the transistor portion 70 is turned off, extraction of minority carriers can be performed effectively. Also, at the time when the diode portion 80 is conductive, injection and accumulation of minority carriers of the boundary mesa portions 94-1 or the diode portion 80 can be suppressed, and reverse recovery destruction can be prevented.

The regions of the peak positions of the doping concentration in the buffer region 20 may be regions including hydrogen donors. The hydrogen donors may be formed by proton implantation. The hydrogen donors may be VOH complex defects formed by vacancies, oxygen and hydrogen. A region F that extends from the position where the doping concentration becomes higher than the doping concentration of the semiconductor substrate to the peak position that is among a plurality of peak positions of the doping concentration in the buffer region 20 and is closest to the upper surface of the semiconductor substrate may have an approximately flat doping concentration. Furthermore, the region F may be a region including hydrogen donors. The region F may be formed to be long in the depth direction below a region where the lifetime killer 96 is formed, as compared with below a region where the lifetime killer 96 is not formed. If the lower surface of the semiconductor substrate is irradiated with the lifetime killer 96, a relatively large amount of defects are formed in a region below a region where the lifetime killer 96 is formed, and it becomes easier for hydrogen from the buffer region 20 to be diffused.

The sum of the distance Dd and the distance De, or the distance Da, may be less than the distance Dt from the lower surface of the semiconductor substrate 10 to the lower surface of the base region 14. If the sum of the distance Dd and the distance De, or the distance Da, is greater than the distance Dt, the minority carrier extraction and reverse recovery destruction prevention effects at the time of turn-off are saturated, and a region that does not contribute to current conductivity (ineffective area) increases, so conduction loss and switching loss begin to increase. In particular, the distance Dd may be shorter than the distance Dt.

The sum of the distance Dd and the distance De, or the distance Da, may be greater than the thermal diffusion length Lt of the semiconductor substrate. Assuming that the thermal conductivity of the semiconductor substrate is κ, the heat capacity per unit volume is C, and the thermal diffusion coefficient of the semiconductor substrate per unit volume is α, α=κ/C. Assuming that a predetermined length of time during which heat is diffused is t, the thermal diffusion length $Lt=2(\alpha t)^{0.5}$. As one example, if the semiconductor substrate is a silicon substrate, α is about $1.5\times10^{-5}$ (m²/s), for example, and if heat is generated for t which is about 1 μs per switching operation (for example, per turn-off or reverse recovery operation), Lt becomes 7.7 μm. Accordingly, the sum of the distance Dd and the distance De, or the distance Da, may be greater than 7.7 µm, for example. The distance Dd or distance De may be set to be longer than the thermal diffusion length Lt. If heat-generation of the transistor portion 70 affects the diode portion 80, temperature of the diode portion 80 increases also. Likewise, if heat-generation of the diode portion 80 affects the transistor portion 70, temperature of the transistor portion 70 increases also. Because increase in temperature results in rise in the concentration of minority carriers, the amount of carriers that should be extracted increases by a corresponding amount. Because if the distance Dd distance De or distance Da is set to be longer than the thermal diffusion length Lt, influence of temperature increase can be suppressed, extraction of carriers becomes easy. A predetermined length of time t during which heat is diffused may be equal to a length of time required for a single switching operation, and may be 0.1 µs to 10 µs, and may be 1 µs, for example.

In the above-mentioned examples in which boundary mesa portions 94-1B are not included (for example, the semiconductor device 100 of FIG. 1 to FIG. 6, the semiconductor device 300 of FIG. 8 to FIG. 13, the semiconductor device 400 of FIG. 14 to FIG. 15, or examples obtained by combining them) also, the above-mentioned relationship may be satisfied by setting the distance De of the present example to 0.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The terms "on", "under", "above", "below", "upper surface", and "lower surface" in the present specification are not limited by the upward and downward directions in relations to the direction of gravity. These terms refer to relative directions in relation to predetermined axes.

What is claimed is:

1. A semiconductor device comprising:
   a semiconductor substrate having a first conductivity type drift region and a second conductivity type base region provided above the drift region;
   a transistor portion formed in the semiconductor substrate; and
   a diode portion formed adjacent to the transistor portion and in the semiconductor substrate, wherein
   in the transistor portion and the diode portion:
   a plurality of trench portions each arrayed along a predetermined array direction; and
   a plurality of mesa portions formed between respective trench portions
   are formed,
   among the plurality of mesa portions, at least one boundary mesa portion at a boundary between the transistor portion and the diode portion includes a second conductivity type contact region that is at an upper surface of the semiconductor substrate and has a concentration higher than that of the base region,
   an area of the contact region at the boundary mesa portion is greater than an area of the contact region at another mesa portion, and
   among the plurality of trench portions, at least one trench portion provided adjacent to a trench portion adjacent to the boundary mesa portion and on the transistor portion side relative to the trench portion adjacent to the boundary mesa portion is a dummy trench portion.

2. The semiconductor device according to claim 1, wherein at least one among the boundary mesa portions is provided in the transistor portion.

3. The semiconductor device according to claim 1, wherein
   at least one among the mesa portions formed in the transistor portion is provided with a first conductivity type accumulation region that is between the base region and the drift region and has a concentration higher than that of the drift region, and
   at least one among the boundary mesa portions is not provided with the accumulation region.

4. The semiconductor device according to claim 3, wherein among the plurality of trench portions, a trench portion adjacent to the boundary mesa portion is a dummy trench portion.

5. The semiconductor device according to claim 4, wherein
   the accumulation region has:
   a first accumulation region formed at a predetermined depth position; and
   a second accumulation region formed closer to the diode portion than the first accumulation region is and at a position shallower than the first accumulation region is, and
   a trench portion adjacent to the second accumulation region is also a dummy trench portion.

6. The semiconductor device according to claim 5, wherein
   at the upper surface of the semiconductor substrate, the mesa portion on the transistor portion side relative to the boundary mesa portion has: a first conductivity type emitter region that has a concentration higher than that of the drift region; and the contact region, and
   the boundary mesa portion does not have the emitter region.

7. The semiconductor device according to claim 5, wherein at least parts of the mesa portions on the diode portion side relative to the boundary mesa portion have the base region at the upper surface of the semiconductor substrate.

8. The semiconductor device according to claim 6, wherein assuming that:
   a distance from a boundary between the transistor portion and the diode portion to the trench portion between the mesa portion having the emitter region and the boundary mesa portion is Da, and
   a distance from a lower surface of the semiconductor substrate to a lower surface of the base region is Dt, 100 µm<Da+Dt<150 µm.

9. The semiconductor device according to claim 6, wherein
   respective trench portions are formed extending in an extension direction different from the array direction at the upper surface of the semiconductor substrate,
   the mesa portion on the transistor portion side relative to the boundary mesa portion has the emitter region and the contact region alternately along the extension direction at the upper surface of the semiconductor substrate, and
   in the extension direction, the accumulation region is formed to reach an outer position relative to an end portion of the outermost emitter region.

10. The semiconductor device according to claim 9, further comprising an interlayer dielectric film formed at the upper surface of the semiconductor substrate, wherein
in the interlayer dielectric film, a contact hole to expose the emitter region and the contact region is formed, and
in the extension direction, the contact hole is formed to reach an outer position relative to an end portion of the accumulation region.

11. The semiconductor device according to claim 1, wherein
at the upper surface of the semiconductor substrate, the mesa portion on the transistor portion side relative to the boundary mesa portion has: a first conductivity type emitter region that has a concentration higher than that of the drift region,
a trench portion that is among the plurality of trench portions and is between the boundary mesa portion and a mesa portion of the transistor portion is a dummy trench portion, and
the dummy trench portion contacts the emitter region.

12. The semiconductor device according to claim 1, wherein a mesa portion of the diode portion is not provided with a first conductivity type accumulation region having a concentration higher than that of the drift region.

13. The semiconductor device according to claim 1, wherein in at least one of the boundary mesa portions, an area of the base region exposed to the upper surface of the semiconductor substrate is greater than an exposed area of the contact region.

14. The semiconductor device according to claim 13, wherein the boundary mesa portion in which the area of the base region exposed to the upper surface of the semiconductor substrate is greater than the exposed area of the contact region is adjacent to the diode portion.

15. The semiconductor device according to claim 13, wherein the boundary mesa portion in which the area of the base region exposed to the upper surface of the semiconductor substrate is greater than the exposed area of the contact region is sandwiched by dummy trench portions.

16. A semiconductor device comprising:
a semiconductor substrate having a first conductivity type drift region and a second conductivity type base region provided above the drift region;
a plurality of trench portions that are formed at an upper surface of the semiconductor substrate arrayed parallel to one another, each of the plurality of trench portions penetrating the base region;
a first conductivity type emitter region having a concentration higher than that of the drift region and a second conductivity type contact region having a concentration higher than that of the base region that are formed in a region adjacent to the trench portion at the upper surface of the semiconductor substrate and alternately along a longitudinal direction of the plurality of trench portions; and
a first conductivity type accumulation region that is formed between the base region and the drift region and has a concentration higher than that of the drift region, wherein
the drift region does not extend above the accumulation region, and
in the longitudinal direction of the plurality of trench portions, the accumulation region is formed to extend beyond an end portion of the emitter region.

17. The semiconductor device according to claim 16, further comprising an interlayer dielectric film formed at the upper surface of the semiconductor substrate, wherein
in the interlayer dielectric film, a contact hole to expose the emitter region and the contact region are formed, and
in the longitudinal direction of the plurality of trench portions, the contact hole is formed to extend beyond an end portion of the accumulation region.

18. The semiconductor device according to claim 17, wherein in the longitudinal direction of the plurality of trench portions, a distance from an end portion of the emitter region to an end portion of the accumulation region is shorter than a distance from the end portion of the accumulation region to an end portion of the contact hole.

19. The semiconductor device according to claim 16, wherein an end portion of the accumulation region in the longitudinal direction of the plurality of trench portions is formed such that a depth of a lower portion thereof decreases toward the end portion of the accumulation region.

20. The semiconductor device according to claim 16, further comprising a second conductivity type well region that is formed at the upper surface of the semiconductor substrate, and has a concentration higher than that of the base region, wherein
at the upper surface of the semiconductor substrate, the base region is formed between the contact region and the well region.

21. The semiconductor device according to claim 16, further comprising an interlayer dielectric film formed at the upper surface of the semiconductor substrate, wherein
in the interlayer dielectric film, a contact hole to expose the emitter region and the contact region are formed, and
in the longitudinal direction, the contact region is formed to extend beyond the contact hole.

22. The semiconductor device according to claim 21, wherein in the longitudinal direction of the plurality of trench portions, a distance from an end portion position of the emitter region to an end portion position of the accumulation region is shorter than a distance from the end portion position of the accumulation region to an end portion position of the contact hole.

23. The semiconductor device according to claim 16, wherein in the longitudinal direction of the plurality of trench portions, an edge of the accumulation region is shallower than the accumulation region below the emitter region.

24. A semiconductor device comprising:
a semiconductor substrate having a first conductivity type drift region and a second conductivity type base region provided above the drift region;
a plurality of trench portions that are formed at an upper surface of the semiconductor substrate arrayed parallel to one another, each of the plurality of trench portions penetrating the base region;
a first conductivity type emitter region having a concentration higher than that of the drift region and a second conductivity type contact region having a concentration higher than that of the base region that are formed in a region adjacent to the trench portion at the upper surface of the semiconductor substrate and alternately along a longitudinal direction of the plurality of trench portions;
a first conductivity type accumulation region that is formed between the base region and the drift region and has a concentration higher than that of the drift region; and
an interlayer dielectric film formed at the upper surface of the semiconductor substrate, wherein the drift region does not extend above the accumulation region, in the interlayer dielectric film, a contact hole is formed to expose the emitter region and the contact region, and in the longitudinal direction of the plurality of trench portions, the contact hole is formed to extend beyond an end portion of the accumulation region.

25. The semiconductor device according to claim 24, wherein in the longitudinal direction of the plurality of trench portions, the contact region is formed to extend beyond the contact hole.

* * * * *